(12) United States Patent
Kim et al.

(10) Patent No.: US 8,358,546 B2
(45) Date of Patent: Jan. 22, 2013

(54) SEMICONDUCTOR DEVICE HAVING ADDITIVE LATENCY

(75) Inventors: Yang-ki Kim, Seoul (KR); Jung-hwan Choi, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 147 days.

(21) Appl. No.: 12/945,521

(22) Filed: Nov. 12, 2010

(65) Prior Publication Data
US 2011/0116330 A1     May 19, 2011

(30) Foreign Application Priority Data
Nov. 13, 2009  (KR) .................. 10-2009-0109694

(51) Int. Cl.
*G11C 7/00* (2006.01)
(52) U.S. Cl. .................. 365/194; 365/189.04; 365/191
(58) Field of Classification Search .................. 365/194, 365/191, 189.04
See application file for complete search history.

(56) References Cited

U.S. PATENT DOCUMENTS

| 7,233,533 | B2 * | 6/2007 | Lee ............................... 365/194 |
| 7,580,319 | B2 * | 8/2009 | Kim et al. ................ 365/230.08 |
| 7,715,272 | B2 * | 5/2010 | Kinoshita et al. ........ 365/233.11 |
| 7,848,178 | B2 * | 12/2010 | Kim et al. .................. 365/233.1 |
| 8,139,429 | B2 * | 3/2012 | Lee ............................... 365/191 |
| 2002/0093871 | A1 * | 7/2002 | Kwak ........................... 365/233 |

FOREIGN PATENT DOCUMENTS

| JP | 2000030456 A | 1/2000 |
| KR | 1020050060844 A | 6/2005 |
| KR | 100734087 B1 | 6/2007 |

* cited by examiner

*Primary Examiner* — Pho M Luu
(74) *Attorney, Agent, or Firm* — Volentine & Whitt, PLLC

(57) ABSTRACT

A semiconductor device receives a command corresponding to a memory access operation and performs the memory access operation after an additive latency period. The additive latency period begins when the command is received. The semiconductor device comprises a phase controller for controlling a phase of a clock signal and outputting a phase-controlled clock signal, and a controller for generating and outputting a control signal for enabling the phase controller that is disabled, at a predetermined time in the additive latency period.

20 Claims, 20 Drawing Sheets

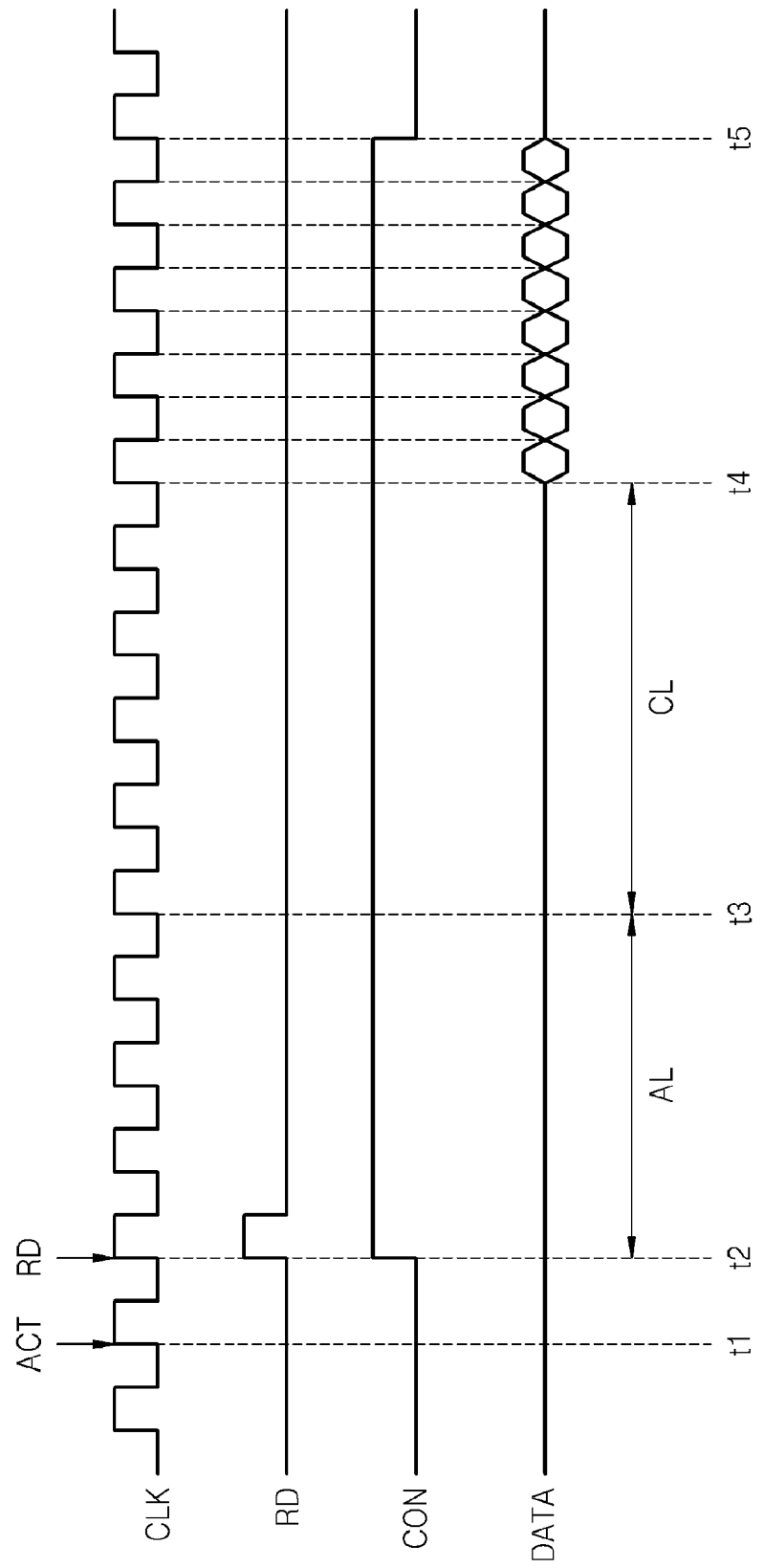

SEMICONDUCTOR DEVICE HAVING ADDITIVE LATENCY

CROSS-REFERENCE TO RELATED APPLICATIONS

This application claims priority under 35 U.S.C. §119 to Korean Patent Application No. 10-2009-0109694 filed on Nov. 13, 2009, the disclosure of which is hereby incorporated by reference in its entirety.

BACKGROUND

Embodiments of the inventive concept relate generally to semiconductor technology. More particularly, embodiments of the inventive concept relate to semiconductor memory devices having additive latency.

Over the last several decades, memory devices have been continually improved to achieve higher levels of storage capacity and operating speed. These improvements have touched on nearly all aspects of the memory devices, including, for instance, their material composition, logical organization, and operating procedures.

Synchronous memory devices represent one class of memory technologies designed to improve operating speed. In synchronous memory devices, memory access operations are synchronized with an external clock signal to improve the efficiency of data access and data transfer. Over the past several years, synchronous memory devices have been enhanced in a variety of ways to improve power consumption, effective data transmission rate, and noise generation. Some of these enhancements include the introduction of double data rate synchronous memories, various data prefetch schemes, on die termination, and additive latency.

Additive latency is modification that can be used, for instance, to reduce the idle time of a memory instruction scheduler of an apparatus incorporating a synchronous memory device. Additive latency comprises an internal delay of a synchronous memory device between a time when a memory access command is received and a time when execution of a corresponding memory access operation begins. The use of the internal delay allows the memory instruction scheduler to transmit access instructions more frequently to the synchronous memory device, which can lead to improved data throughput.

SUMMARY

Embodiments of the inventive concept provide various semiconductor devices having additive latency. Selected embodiments provide reduced power consumption compared with conventional devices.

According to one embodiment, a semiconductor device receives a command and performs a corresponding memory access operation at the end of an additive latency period that starts when the command is received. The semiconductor device comprises a phase controller that controls a phase of a clock signal to generate a phase-controlled clock signal, and a controller that generates a control signal with a first logic state to change the phase controller from a disabled state to an enabled state at a predetermined time in the additive latency period.

In certain embodiments, the controller maintains the control signal in the first logic state during an interval between the predetermined time and a completion time of the memory access operation, and changes the control signal to a second logic state to disable the phase controller at other times.

In certain embodiments, the phase controller comprises a delay-locked loop that controls the phase of the clock signal, and a connection unit that facilitates or blocks transmission of the clock signal to the delay-locked loop according to the control signal.

In certain embodiments, the phase controller comprises a phase-locked loop that controls the phase of the clock signal, and a connection unit that facilitates or blocks transmission of the clock signal to the phase-locked loop according to the control signal.

In certain embodiments, the command is a read command, a write command, or an on-die termination command.

In certain embodiments, the controller comprises a plurality of delay units that are connected in series, and that delay and output the command according to the clock signal, an OR gate that performs an OR operation on at least two signals selected from among the command and output signals of the respective delay units, and outputs the control signal as a result of the OR operation.

In certain embodiments, the semiconductor device further comprises a latency controller that generates a plurality of latency control signals based on the phase-controlled clock signal and outputs the latency control signals, an internal command generation unit that outputs an internal command based on the command after the end of the additive latency period, and a command execution controller that controls the memory access operation based on the internal command and the latency control signals. The control signal further enables all disabled units among the phase controller, the latency controller, and the command execution controller at the predetermined time in the additive latency period.

In certain embodiments, the control signal enables the phase controller, the latency controller, and the command execution controller from the predetermined time until a completion time of the memory access operation, and disables at least one of the phase controller, the latency controller, and the command execution controller at other points of time.

In certain embodiments, the controller comprises a first OR gate that performs an OR operation on the command and the internal command, a plurality of delay units that are connected in series, and that delay and output an output signal of the first OR gate according to the clock signal, and a second OR gate that performs the OR operation on at least two signals selected from among the output signal of the first OR gate and output signals of the respective delay units, and that outputs the control signal as a result of the OR operation.

In certain embodiments, the internal command generation unit comprises a plurality of delay units that delay and output the command according to the clock signal.

In certain embodiments, the latency controller comprises a plurality of delay units that are connected in series, and that delay the output signal of the phase controller and output the respective latency control signals, and a connection unit that controls a connection between the phase controller and the plurality of delay units or between the plurality of delay units, according to the control signal.

In certain embodiments, the command execution controller comprises a plurality of delay units that are connected in series, and that delay the internal command according to a corresponding one of the latency control signals, and a connection unit that controls a connection between the latency controller and the plurality of delay units, between the internal command generation unit and the plurality of delay units, or between the plurality of delay units, according to the control signal.

According to another embodiment of the inventive concept, a semiconductor device is configured to receive a read or write command and to perform an operation corresponding to the read or write command after a first additive latency period that starts when the semiconductor device receives the read/write command, and is further configured to receive an on-die termination command and to perform the on-die termination command after a second additive latency period that starts when the semiconductor device receives the on-die termination command. The semiconductor device comprises a phase controller that controls a phase of a clock signal and outputs a phase-controlled clock signal, a first controller that generates and outputs a first control signal to change the phase controller from a disabled state to an enabled state at a predetermined time in the first additive latency period, and a second controller that generates and outputs a second control signal to change the phase controller from the disabled state to the enabled state at a predetermined time in the second additive latency period.

In certain embodiments, the first controller generates and outputs the first control signal with a first logic state to enable the phase controller from the predetermined time in the first additive latency period until a completion time of the operation corresponding to the read or write command, and generates and outputs the first control signal with a second logic state to disable the phase controller at other points of time, and the second controller generates and outputs the second control signal with the first logic state to enable the phase controller from the predetermined time in the second additive latency period until a completion time of the operation corresponding to the ODT command, and generates and outputs the second control signal with the second logic state to disable the phase controller at other points of time.

In certain embodiments, the first controller comprises a plurality of first delay units that are connected in series, and that delay and output the read or write command according to the clock signal, and a first OR gate that performs an OR operation on at least two signals selected from among the read or write command and output signals of the first delay units, and outputs the first control signal as a result of the OR operation. The second controller comprises a plurality of second delay units that are connected in series, and that delay and output the on-die termination command according to the clock signal, and a second OR gate that performs an OR operation on at least two signals selected from among the on-die termination command and output signals of the second delay units, and outputs the second control signal as a result of the OR operation.

According to another embodiment of the inventive concept, a semiconductor device is configured to receive a read or write command and to perform an operation corresponding to the read or write command after a first additive latency period that starts when the semiconductor device receives the read/write command, and is further configured to receive an on-die termination command and to perform the on-die termination command after a second additive latency period that starts when the semiconductor device receives the on-die termination command. The semiconductor device comprises a phase controller configured to control a phase of a clock signal and output a phase-controlled clock signal, and a latency controller configured to generate and output a plurality of latency control signals based on the phase-controlled clock signal. The semiconductor device further comprises a first internal command generation unit configured to output an internal read command or an internal write command based on the read or write command after the first additive latency period, and a first command execution controller configured to control the operation corresponding to the read command based on the internal read command and the latency control signals, or to control the operation corresponding to the write command based on the internal write command and the latency control signals. The semiconductor device still further comprises a second internal command generation unit configured to output an internal on-die termination command based on the on-die termination command after the second additive latency period, and a second command execution controller configured to control the operation corresponding to the on-die termination command based on the internal ODT command and the latency control signals. The semiconductor device further comprises a first controller configured to generate and output a first control signal to enable all disabled units among the phase controller, the latency controller, and the first command execution controller at a predetermined time in the first additive latency period, and a second controller configured to generate and output a second control signal to enable all disabled units among the phase controller, the latency controller, and the second command execution controller at a predetermined time in the second additive latency period.

In certain embodiments, the first controller generates and outputs the first control signal to enable the phase controller, the latency controller, and the first command execution controller from the predetermined time in the first additive latency period until a completion time of the operation corresponding to the read or write command, and generates and outputs the first control signal to disable at least one of the phase controller, the latency controller, and the first command execution controller at other points of time. The second controller generates and outputs the second control signal to enable the phase controller, the latency controller, and the second command execution controller from the predetermined time in the second additive latency period until a completion time of the operation corresponding to the on-die termination command, and to disable at least one selected of the phase controller, the latency controller, and the second command execution controller at other points of time.

In certain embodiments, the first controller comprises a first OR gate that performs an OR operation on the read command and the internal read command or on the write command and the internal write command, a plurality of first delay units that are connected in series, wherein each of the first delay units delays and outputs an output signal of the first OR gate according to the clock signal, and a second OR gate that performs an OR operation on at least two signals from among the output signal of the first OR gate and output signals of the respective first delay units, and then outputs the first control signal as a result of the OR operation of the second OR gate. The second controller comprises a third OR gate that performs an OR operation on the on-die termination command and the internal on-die termination command, a plurality of second delay units that are connected in series, where each of the second delay units delays and outputs an output signal of the third OR gate according to the clock signal, and a fourth OR gate that performs an OR operation on at least two signals from among the output signal of the third OR gate and output signals of the respective second delay units, and then outputs the second control signal as a result of the OR operation of the fourth OR gate.

In certain embodiments, the latency controller comprises a plurality of delay units that are connected in series, wherein each of the delay units delays an output signal of the phase controller and outputs a corresponding one of the latency control signals, and a connection unit that controls a connection between the phase controller and the delay units or between the delay units according to the first control signal or the second control signal.

In certain embodiments, the first command execution controller comprises a plurality of first delay units that are connected in series, and that delay the internal read command or the internal write command according to the latency control signals, and a first connection unit that controls a connection between the latency controller and the first delay units, a connection between the first internal command generation unit and the first delay units, or a connection between the first delay units according to the first control signal. The second command execution controller comprises a plurality of second delay units that are connected in series, and that delay the internal ODT command according to the latency control signals, and a second connection unit that controls a connection between the latency controller and the second delay units, a connection between the second internal command generation unit and the second delay units, or a connection between the second delay units according to the second control signal.

BRIEF DESCRIPTION OF THE DRAWINGS

The drawings illustrate various embodiments of the inventive concept. In the drawings, like reference numbers indicate like features.

FIG. 4 is a timing diagram illustrating the operation of the semiconductor device of FIG. 1 according to an embodiment of the inventive concept.

DETAILED DESCRIPTION OF THE EMBODIMENTS

Embodiments of the inventive concept are described below with reference to the accompanying drawings. These embodiments are presented as teaching examples and should not be construed to limit the scope of the inventive concept.

Figure 1:
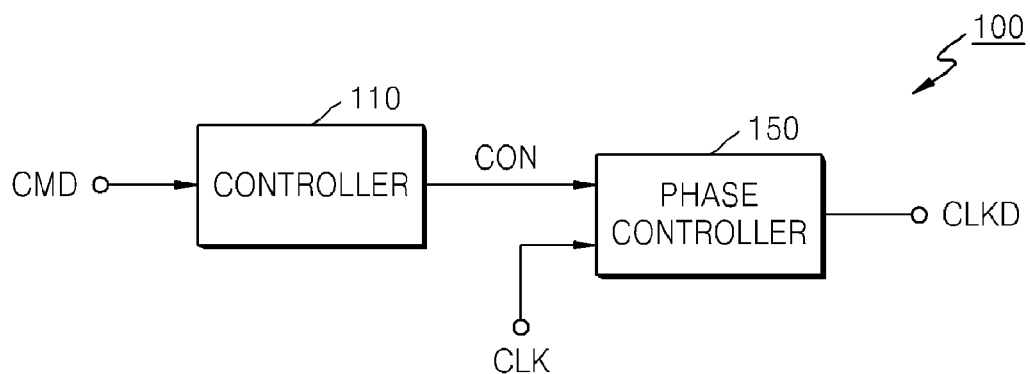
FIG. 1 is a block diagram of a semiconductor device according to an embodiment of the inventive concept.

FIG. 1 is a block diagram of a semiconductor device 100 according to an embodiment of the inventive concept. Referring to FIG. 1, semiconductor device 100 comprises a controller 110 and a phase controller 150.

Controller 110 generates and outputs a control signal CON with a first logic state to enable phase controller 150 from a predetermined time in an additive latency period until completion of an operation corresponding to a command CMD. At other times, controller 110 generates and outputs control signal CON with a second logic state to disable phase controller 150. For explanation purposes, it will be assumed that the first logic state is a logic "high" state and the second logic state is a logic "low" state. However, these state assignments could be altered in other embodiments.

The additive latency period typically comprises a time interval between receipt of command CMD by a memory device incorporating semiconductor device 100 and the end of a corresponding row address strobe (RAS) to column address strobe (CAS) delay tRCD. In other words, the additive latency period can begin when the memory device receives command CMD and can end when RAS to CAS delay tRCD ends. The additive latency period is generally measured in cycles of a clock signal CLK that controls the timing of semiconductor device 100.

The memory device incorporating semiconductor device 100 (hereafter, "the memory device") can be any device having the necessary components for performing operations corresponding to command CMD. Where the additive latency is '2', for instance, the memory device performs a read operation after a lapse of two cycles of clock signal CLK starting from a time a read command is input to the memory device.

Command CMD typically comprises a read command, a write command, or an on-die termination (ODT) command. The read command instructs the memory device to perform a read operation, and the write command instructs the memory device to perform a write operation. The ODT command instructs the memory device to perform an ODT operation to minimize signal reflection when data is input to or output from the memory device.

An embodiment of controller 110 will be described in further detail with reference to FIGS. 2 and 4.

Phase controller 150 controls the phase of clock signal CLK to generate a phase-controlled clock signal CLKD and outputs phase-controlled clock signal CLKD to a predetermined unit of the memory device. Phase controller 150 is enabled according to control signal CON between the beginning of the additive latency period and completion of the operation corresponding to command CMD. Phase controller 150 is disabled according to control signal CON following completion of the operation corresponding to command CMD, and remains disabled even when the memory device is subsequently activated. Because phase controller 150 is enabled at certain times and disabled at other times as described above, the memory device can perform the operation corresponding to command CMD while minimizing power consumption.

An embodiment of phase controller 150 will be described in further detail with reference to FIGS. 3A to 4.

Figure 2:
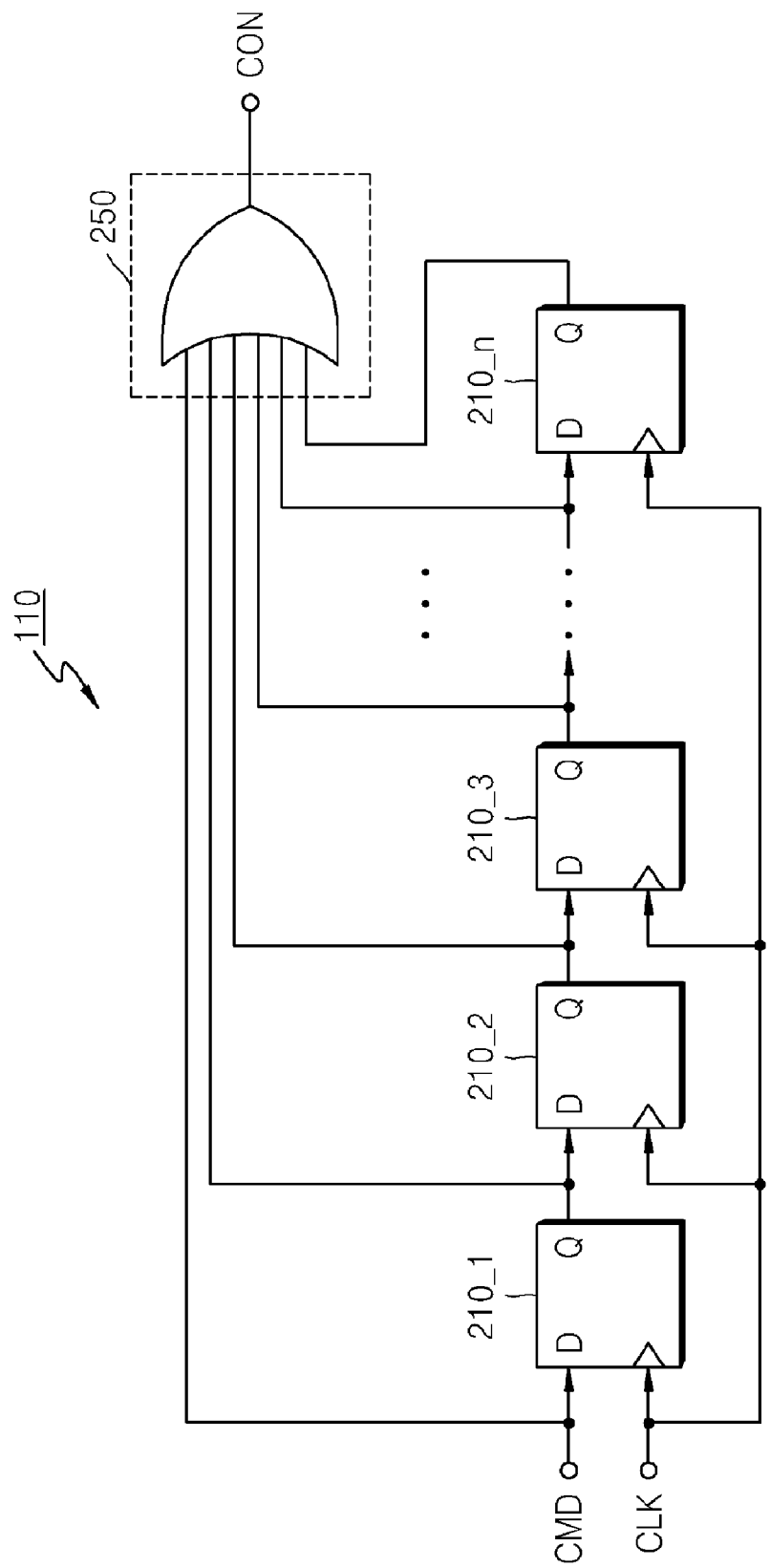
FIG. 2 is a circuit diagram of a controller in the semiconductor device of FIG. 1 according to an embodiment of the inventive concept.

FIG. 2 is a circuit diagram of controller 110 in semiconductor device 100 according to an embodiment of the inventive concept. Referring to FIGS. 1 and 2, controller 110 comprises "n" delay units 210_1 through 210_n, and an OR gate 250, where "n" is a natural number.

Delay units 210_1 through 210_n are connected in series, and delay unit 210_1 delays and outputs command CMD according to clock signal CLK. Each of delay units 210_2 through 210_n delays and outputs an output signal of a preceding delay unit thereof according to clock signal CLK. OR gate 250 receives command CMD and at least two signals selected from among the output signals of delay units 210_1 through 210_n, performs an OR operation on command CMD and the at least two signals, and outputs control signal CON as a result.

In the embodiment of FIG. 2, the OR operation is performed on command CMD and the output signals of delay units 210_1 through 210_n and control signal CON is output as the result. However, in alternative embodiments, controller 110 can perform the OR operation on command CMD and at least two signals selected from among the output signals of delay units 210_1 through 210_n. Also, in the embodiment of FIG. 2, controller 110 generates control signal CON by delaying command CMD. However, in alternative embodiments, controller 110 can generate control signal CON using another signal indicating a time when command CMD is received. Moreover, in the embodiment of FIG. 2, delay units 210_1 through 210_n are flip flops. However, in alternative embodiments, delay units 210_1 through 210_n can be formed by other devices capable of generating control signal CON with logic states as described above.

Figure 3A:
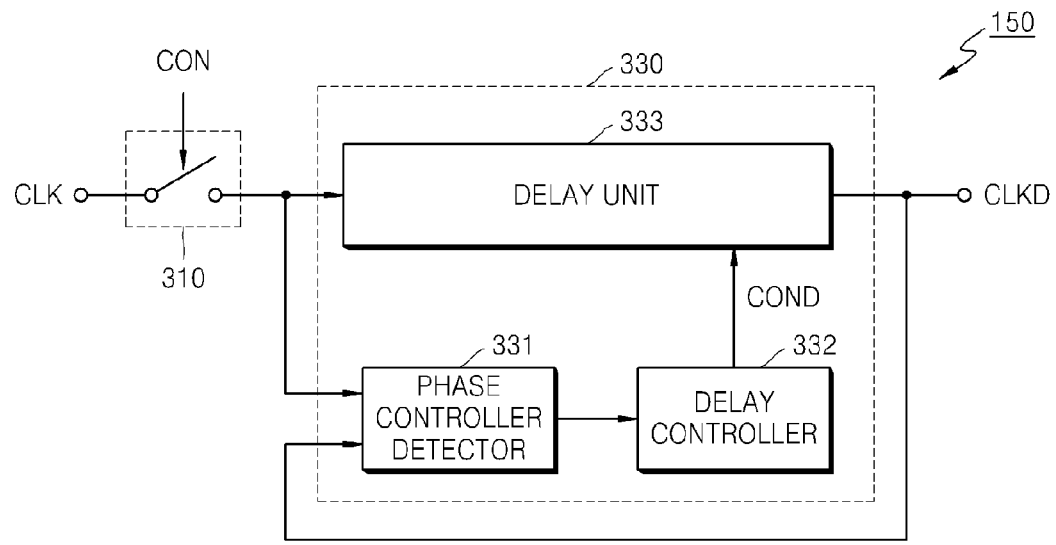
FIG. 3A is a block diagram of a phase controller in the semiconductor device of FIG. 1 according to an embodiment of the inventive concept.

FIG. 3A is a block diagram of phase controller 150 in semiconductor device 100 according to an embodiment of the inventive concept. In the embodiment of FIG. 3A, phase controller 150 comprises a connection unit 310 and a delay locked loop (DLL) 330. Connection unit 310 transmits clock signal CLK to DLL 330 or blocks the transmission of clock signal CLK to DLL 330 according to control signal CON. More specifically, connection unit 310 transmits clock signal CLK to DLL 330 where control signal CON is in the first logic state and blocks the transmission of clock signal CLK to DLL 330 where control signal CON is in the second logic state.

DLL 330 comprises a phase detector 331, a delay controller 332, and a delay unit 333. Phase detector 331 detects a phase difference between clock signal CLK and phase-controlled clock signal CLKD by comparing clock signal CLK and phase-controlled clock signal CLKD, and outputs an output signal indicating the phase difference. Delay controller 332 outputs a delayed control signal COND to control delay unit 333 according to the output signal of phase detector 331. Delay unit 333 delays clock signal CLK for a predetermined time according to the delayed control signal COND and outputs phase-controlled clock signal CLKD. Delay unit 333 typically comprises a plurality of delay units each comprising an inverter or a flip flop.

Figure 3B:
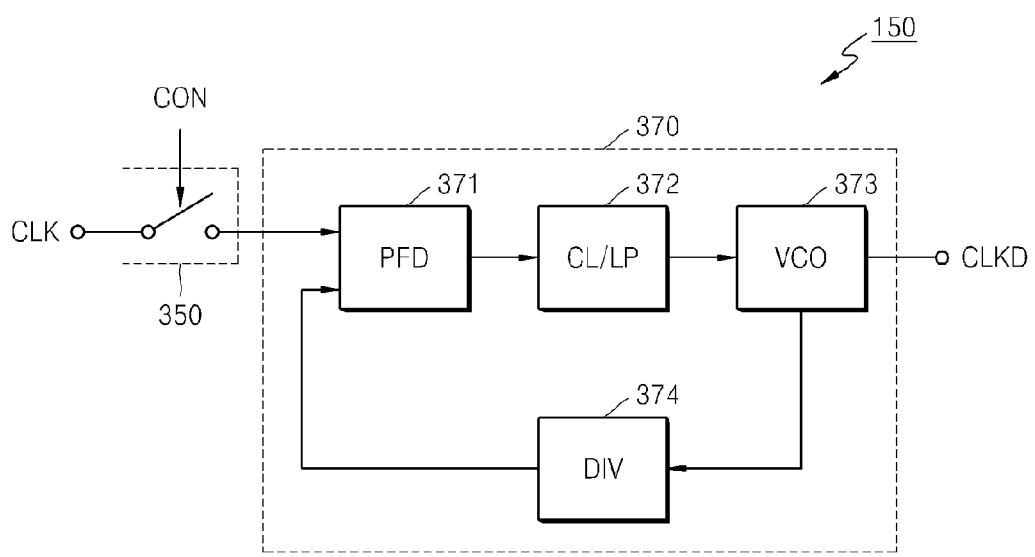
FIG. 3B is a block diagram of the phase controller in the semiconductor device of FIG. 1 according to another embodiment of the inventive concept.

FIG. 3B is a block diagram of phase controller 150 in semiconductor device 100 according to another embodiment of the inventive concept. In the embodiment of FIG. 3B, phase controller 150 comprises a connection unit 350 and a phase-locked loop (PLL) 370. Connection unit 350 transmits clock signal CLK to PLL 370 or blocks the transmission of clock signal CLK to PLL 370 according to control signal CON. More specifically, connection unit 350 transmits clock signal CLK to PLL 370 where control signal CON is in the first logic state, and blocks the transmission of clock signal CLK to PLL 370 where control signal CON is in the second logic state.

PLL 370 comprises a phase frequency detector (PFD) 371, a charge pump/loop filter (CP/LP) 372, a voltage controlled oscillator (VCO) 373, and a divider (DIV) 374. PFD 371 compares clock signal CLK with an output signal of divider 374 to detect a phase difference between these signals, and then generates an output signal indicating the phase difference. CP/LP 372 transforms the output signal of PFD 371 into a control voltage signal Vctrl for VCO 373. VCO 373 outputs phase-controlled clock signal CLKD with a predetermined frequency according to control voltage signal Vctrl. Divider 374 divides the clock signal received from VCO 373 at a predetermined ratio and outputs a result of the division.

In the embodiments of FIGS. 3A and 3B, connection units 310 and 350 comprise switches that switch on or off according to control signal CON. However, in other embodiments, connection units 310 and 350 can comprise other types of devices, e.g., transistors, that capable of transmitting or blocking clock signal CLK from DLL 330 or PLL 370 according to the logic state of control signal CON. Also, in the embodiment of FIG. 3A, connection unit 310 transmits or blocks clock signal CLK. However, in other embodiments, connection unit 310 can transmit or block signals between units (not shown) of DLL 310. Similarly, in the embodiment of FIG. 3B, connection unit 350 transmits or blocks clock signal CLK. However, in other embodiments, connection unit 350 can transmit or block a signal between units (not shown) of PLL 370.

FIG. 4 is a timing diagram illustrating the operation of semiconductor device 100 according to an embodiment of the inventive concept. The embodiment of FIG. 4 will be described with reference to FIGS. 1 through 4.

For explanation purposes, it will be assumed that command CMD is a read command RD performed by the memory device incorporating semiconductor device 100. It will also be assumed that an additive latency period AL is '4' clock cycles and a column address strobe (CAS) latency period CL is '5' clock cycles.

The memory device receives read command RD at a time t2, and begins to perform a read operation at a time t3, which is four cycles of clock signal CLK after time t2. The memory device begins to output read data at a time t4, which is five cycles of clock signal CLK after time t3. The memory device continues to output the read data until a time t5, which is four cycles of clock signal CLK after time t4.

Controller 110 generates control signal CON with the second logic state before time t2, with the first logic state from time t2 to time t5, and with the second logic state after time t5. Control signal CON is in the second logic state during an activation period ACT between a time t1 and time t2, and changes from the second logic state to the first logic state at the beginning of additive latency period AL from time t2 to time t3.

Where controller 110 takes the form illustrated in FIG. 2, control signal CON can operate as shown in FIG. 4. For instance, OR gate 250 of controller 110 of FIG. 2 can perform an OR operation on command CMD and the output signals of delay units 210_1 through 210_n, and control signal CON can change from the second logic state to the first logic state at time t2 as illustrated in FIG. 4. Where OR gate 250 performs the OR operation on only the output signals of delay unit 210_1 through 210_n, control signal CON is changed from the second logic state to the first logic state after two cycles of clock signal CLK starting from time t2. Accordingly, by controlling the signals on which the OR operation is performed, it is possible to control a time when control signal CON is changed from the second logic state to the first logic state.

Control signal CON is in the first logic state between time t2 and time t5, and in the second logic state at other points of time. Accordingly, phase controller 150 is enabled between time t2 and time t5 and disabled at other points of time. As a result, phase controller 150 can remain disabled until the predetermined time in additive latency period AL to prevent unnecessary power consumption.

Figure 5:
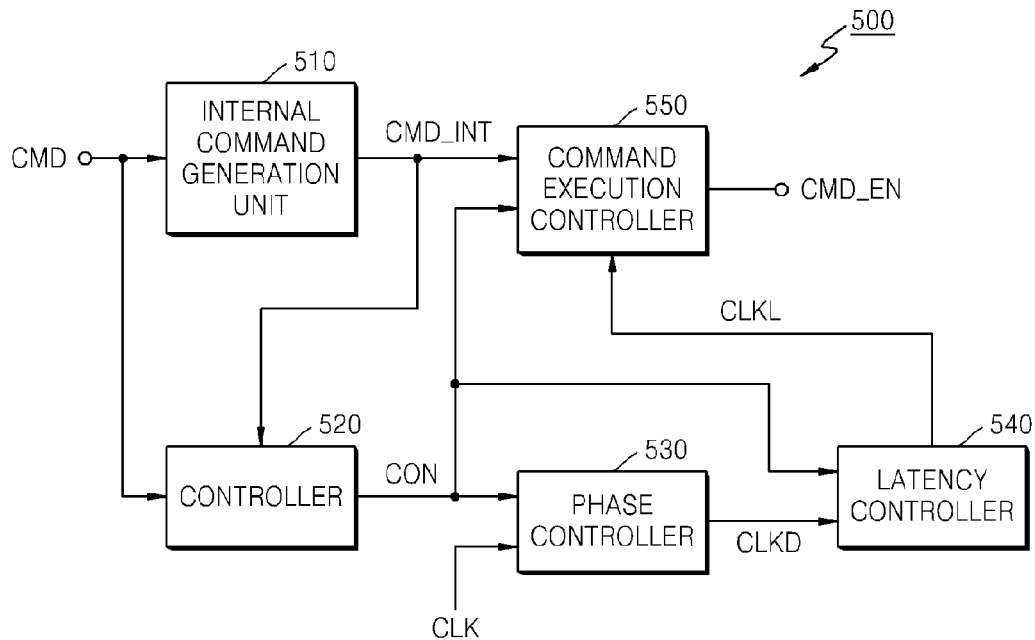
FIG. 5 is a block diagram of a semiconductor device according to another embodiment of the inventive concept.

FIG. 5 is a block diagram of a semiconductor device 500 according to another embodiment of the inventive concept. Referring to FIG. 5, semiconductor device 500 comprises an internal command generation unit 510, a controller 520, a phase controller 530, a latency controller 540, and a command execution controller 550.

Internal command generation unit 510 receives command CMD and generates an internal command CMD_INT from command CMD after additive latency period AL ends. An embodiment of internal command generation unit 510 will be described in further detail with reference to FIGS. 6 and 9.

Controller 520 generates and outputs control signal CON with a logic state to enable phase controller 530, latency controller 540, and command execution controller 550 at a predetermined time in additive latency period AL. For instance, controller 520 typically generates and outputs control signal CON with the first logic state to enable phase controller 530, latency controller 540, and command execution controller 550 from the predetermined time until completion of the operation corresponding to command CMD, and then generates and outputs control signal CON to the second logic state to disable at least one of phase controller 530, latency controller 540, and command execution controller 550. An embodiment of controller 520 will be described in further detail with reference to FIGS. 7 and 9.

Phase controller 530 generates phase-controlled clock signal CLKD by controlling the phase of clock signal CLK, and supplies phase-controlled clock signal CLKD to latency controller 540. Phase controller 530 is enabled or disabled according to control signal CON. The structure of phase controller 530 can be the same as or similar to that of phase controller 150 of FIG. 3A or 3B.

Latency controller 540 generates a plurality of latency control signals CLKL from phase-controlled clock signal CLKD received from phase controller 530 and supplies latency control signals CLKL to command execution controller 550. Latency controller 540 is enabled or disabled according to control signal CON. An embodiment of latency controller 540 will be described in further detail with reference to FIG. 8.

Command execution controller 550 generates and outputs an enable signal CMD_EN to control the operation corresponding to command CMD. The value of enable signal CMD_EN is based on internal command CMD_INT received from internal command generation unit 510 and latency control signals CLKL received from latency controller 540. Command execution controller 550 is enabled or disabled according to control signal CON. For example, where command CMD is a read command, command execution controller 550 supplies enable signal CMD_EN to a data output buffer (not shown) of a memory device (not shown). The data output buffer outputs data read from a memory cell of the memory device via a data output pad (not shown) according to enable signal CMD_EN. An embodiment of command execution controller 550 will be described in further detail with reference to FIG. 8.

In the embodiment of FIG. 5, phase controller 530, latency controller 540, and command execution controller 550 are enabled according to control signal CON between the predetermined time in additive latency period AL and completion of the operation corresponding to command CMD. Then, at least one of phase controller 530, latency controller 540, and command execution controller 550 is disabled according to control signal CON after completion of the operation corresponding to command CMD, and is kept disabled even when the memory device including semiconductor device 500 is activated. Accordingly, the memory device comprising semiconductor device 500 is capable of reducing power consumption while access operations are not being performed.

Figure 6:
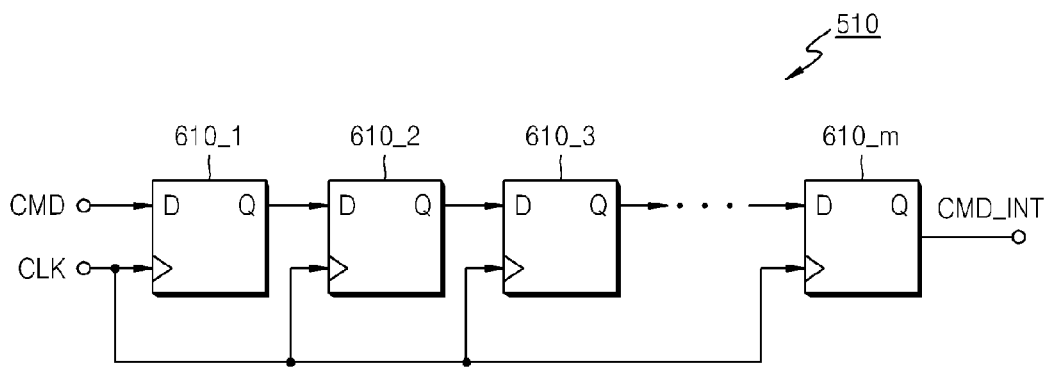
FIG. 6 is a circuit diagram of an internal command generation unit in the semiconductor device of FIG. 5 according to an embodiment of the inventive concept.

FIG. 6 is a circuit diagram of an embodiment of internal command generation unit 510 in semiconductor device 500 of FIG. 5. Referring to FIGS. 5 and 6, internal command generation unit 510 comprises "m" first delay units 610_1 through 610_m, where "m" is a natural number. First delay units 610_1 through 610_m are connected in series, and first delay unit 610_1 delays and outputs command CMD according to clock signal CLK. Each of first delay units 610_2 through 610_m delays and outputs an output signal of a preceding delay unit according to clock signal CLK. That is, in internal command generation unit 510, command CMD is sequentially input to first delay units 610_1 through 610_m to be delayed for a predetermined time to generate internal command CMD_INT.

Figure 7:
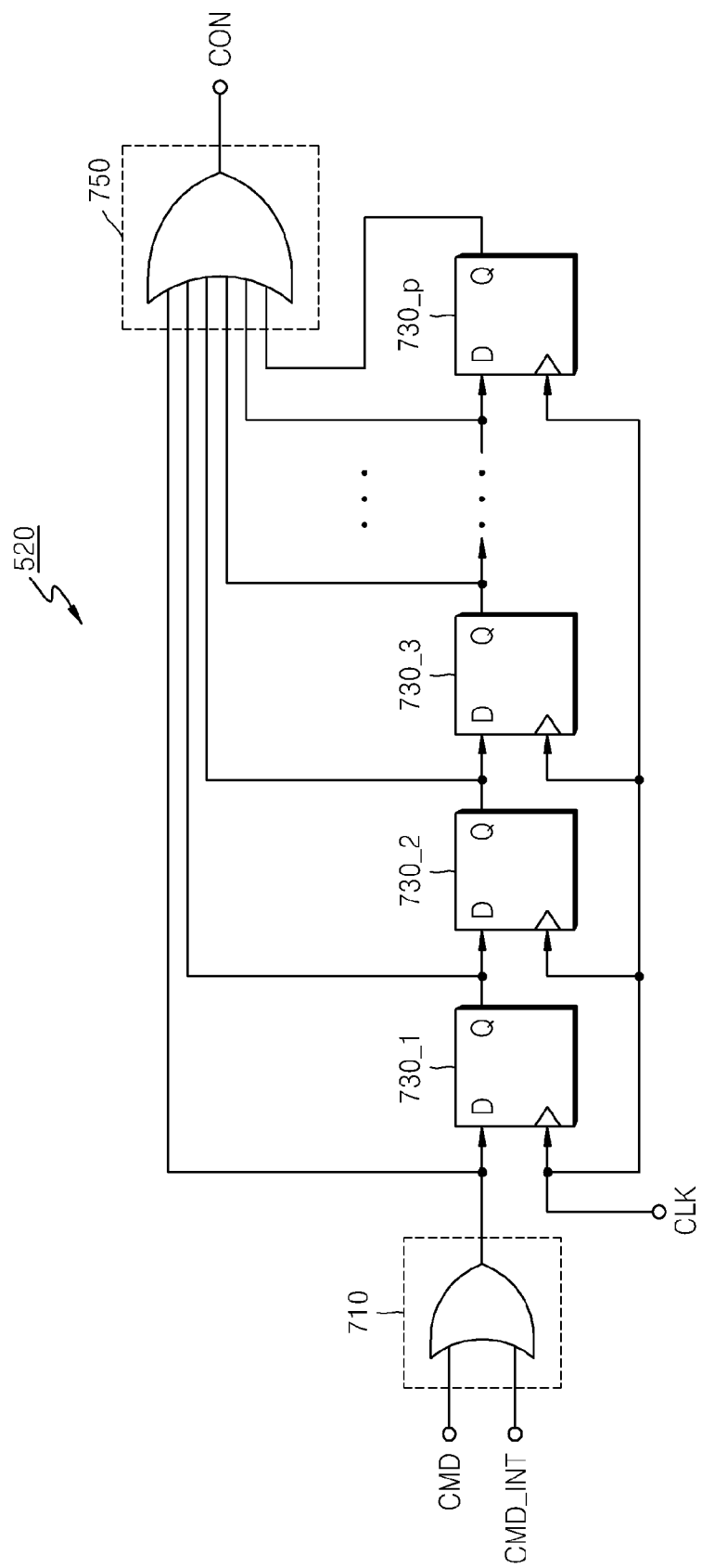
FIG. 7 is a circuit diagram of a controller in the semiconductor device of FIG. 5 according to an embodiment of the inventive concept.

FIG. 7 is a circuit diagram of an embodiment of controller 520 in semiconductor device 500 of FIG. 5. Referring to FIGS. 5 and 7, controller 520 comprises a first OR gate 710, "p" second delay units 730_1 through 730_p, and a second OR gate 750, where "p" is a natural number.

First OR gate 710 receives command CMD and performs an OR operation on command CMD and internal command CMD_INT. Second delay units 730_1 through 730_p are connected in series, and second delay unit 730_1 delays and outputs an output signal of first OR gate 710 according to clock signal CLK. Each of second delay units 730_2 through 730_p receives and delays an output signal of a preceding second delay unit according to clock signal CLK to generate an output signal. Second OR gate 750 receives at least two signals from the output signal of first OR gate 710 and the output signals of the respective second delay units 730_1 through 730_p, performs the OR operation on the at least two output signals, and outputs control signal CON as a result of the OR operation.

In the embodiment of FIG. 7, the OR operation is performed on the output signal of first OR gate 710 and all the output signals of second delay units 730_1 through 730_p, and control signal CON is output as the result of the OR operation. However, in other embodiments, controller 520 can generate control signal CON by performing the OR operation on at least two signals selected from among the output signal of first OR gate 710 and the output signals of the respective second delay units 730_1 through 730_p. Also, in the embodiment of FIG. 7, controller 520 generates control signal CON by delaying the output signal of first OR gate 710. However, in other embodiments, controller 520 can generate control signal CON by using any other signal indicating points of time when command CMD and internal command CMD_INT are received. Although FIG. 7 illustrates that second delay units 730_1 through 730_p are flip flops, they can alternatively be implemented using any other devices capable of generating control signal CON with logic states described above.

Figure 8:
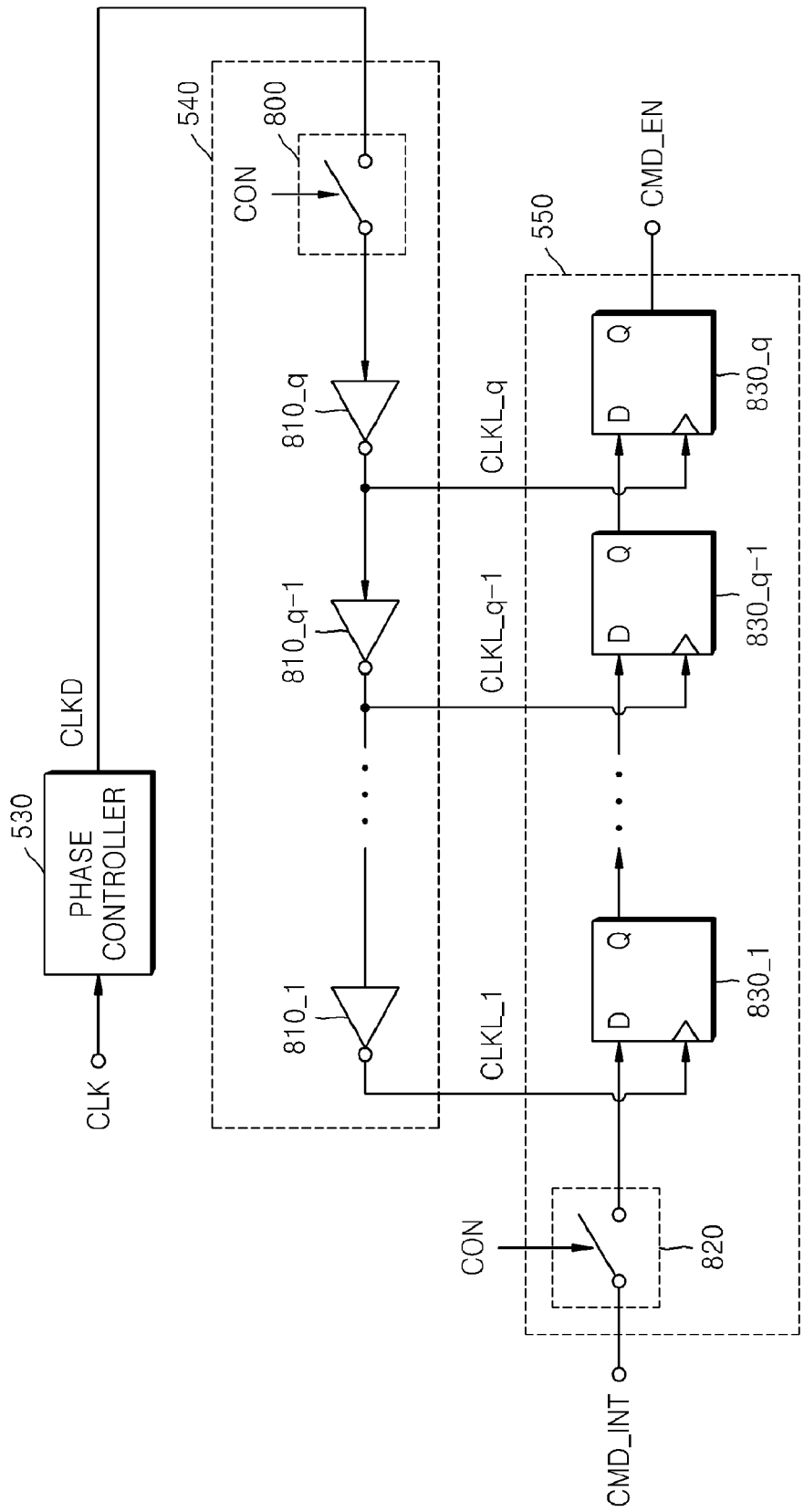
FIG. 8 is a circuit diagram of a phase controller, a latency controller, and a command execution controller in the semiconductor device of FIG. 5 according to an embodiment of the inventive concept.

FIG. 8 is a circuit diagram of phase controller 530, latency controller 540, and command execution controller 550 in semiconductor device 500 of FIG. 5, according to an embodiment of the inventive concept. In the embodiment of FIG. 8, phase controller 530 outputs a phase-controlled clock signal CLKD by controlling the phase of clock signal CLK. The structure of phase controller 530 is the same as or similar to that of phase controller 150 of FIG. 3A or 3B.

Latency controller 540 comprises a first connection unit 800 and "q" third delay units 810_1 through 810_q, where "q" is a natural number. First connection unit 800 facilitates or blocks transmission of phase-controlled clock signal CLKD to third delay unit 810_q according to control signal CON. More specifically, first connection unit 800 transmits phase-controlled clock signal CLKD to third delay unit 810_q where control signal CON is in the first logic state and blocks transmission of phase-controlled clock signal CLKD to third delay unit 810_q where control signal CON is in the second logic state.

Third delay units 810_1 through 810_q are connected in series, and third delay unit 810_q outputs a latency control signal CLKL_q by delaying phase-controlled clock signal CLKD. Third delay units 810_1 through 810_q output latency control signals CLKL_1 through CLKL_q-1 by delaying output signals of respective preceding delay units.

Command execution controller 550 comprises a second connection unit 820 and "q" fourth delay units 830_1 through 830_q. Second connection unit 820 facilitates or blocks transmission of an internal command CMD_INT to fourth delay unit 830_1 according to control signal CON. More specifically, second connection unit 820 transmits internal command CMD_INT to fourth delay unit 830_1 where control signal CON has the first logic state, and blocks the transmission of internal command CMD_INT to fourth delay unit 830_1 where control signal CON has the second logic state.

Fourth delay units 830_1 through 830_q are connected in series and fourth delay unit 830_1 delays and outputs internal command CMD_INT according to a latency control signal CLKL_1 received from third delay unit 810_1. Fourth delay units 830_2 through 830_q delay and output the output signals of preceding delay units according to respective latency control signals CLKL_2 through CLKL_q. In other words, in command execution controller 550, internal command CMD_INT is input sequentially to fourth delay units 830_1 through 830_q to be delayed for a predetermined time, thereby generating an enable signal CMD_EN.

In the embodiment of FIG. 8, first connection unit 800 and second connection unit 820 comprise switches that switch on or off according to control signal CON. However, in other embodiments, first connection unit 800 and second connection unit 820 can comprise other devices, such as transistors, for enabling or disabling latency controller 540 or command execution controller 550 according to the logic state of control signal CON.

Although FIG. 8 illustrates that first connection unit 800 facilitates or blocks the transmission of phase-controlled clock signal CLKD, first connection unit 800 could alternatively transmit or block transmission of a signal to third delay units 810_1 through 810_q. Additionally, although FIG. 8 illustrates that second connection unit 820 transmits or blocks transmission of internal command CMD_INT, second connection unit 820 could alternatively transmit or block transmission of a signal to fourth delay units 830_1 through 830_q. Moreover, second connection unit 820 could transmit or block transmission of all or some of latency control signals CLKL_1 through CLKL_q-1 to third delay units 810_1 through 810_q and fourth delay units 830_1 through 830_q.

In the embodiment of FIG. 8, third delay units 810_1 through 810_q comprise inverters and fourth delay units 830_1 through 830_q comprise as flip flops. However, in other embodiments, the inverters or flip flops can be replaced with other devices capable of generating either latency control signals CLKL_1 through CLKL_q or enable signal CMD_EN.

Figure 9:
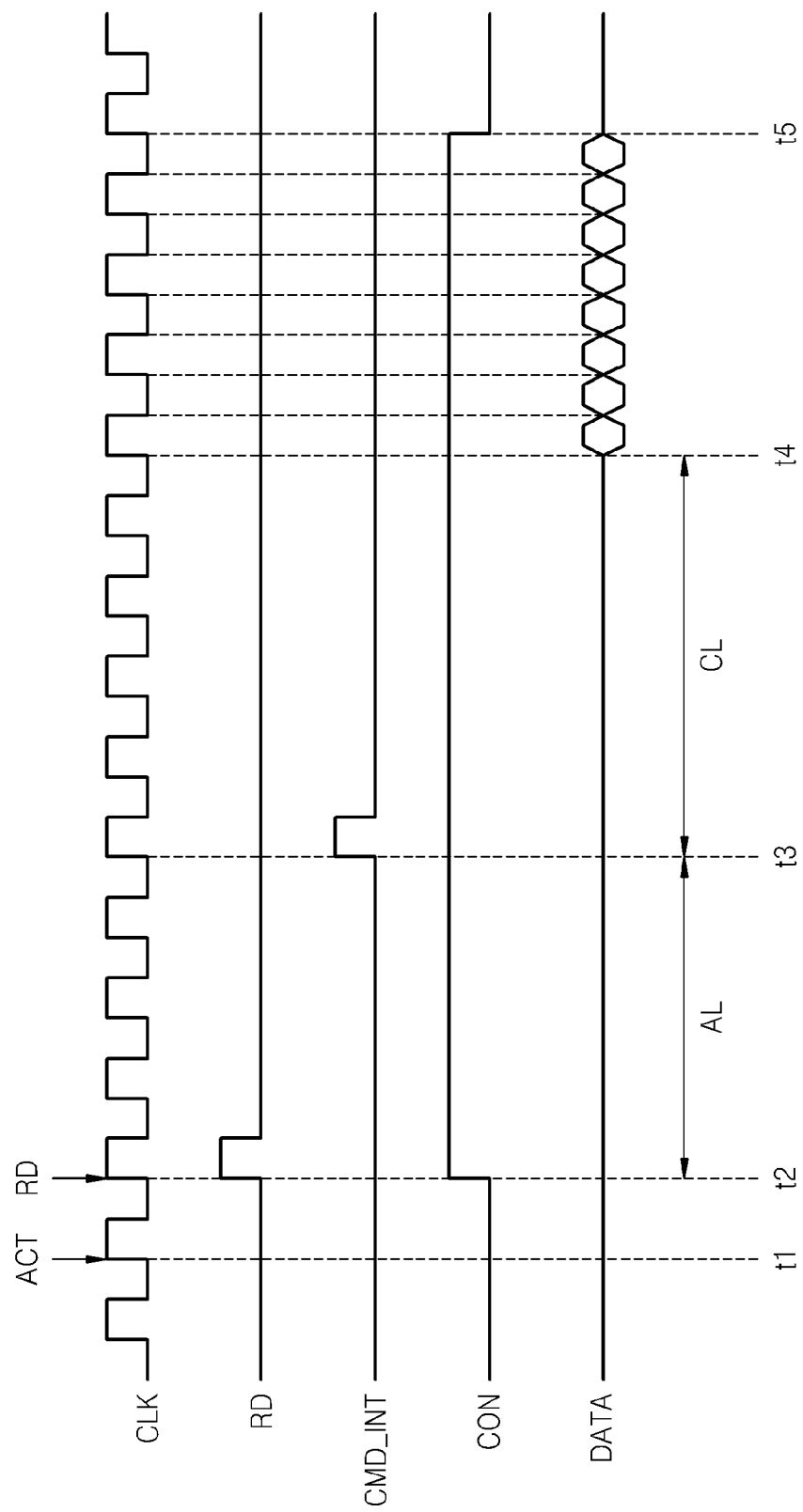
FIG. 9 is a timing diagram illustrating the operation of the semiconductor device of FIG. 5 according to an embodiment of the inventive concept.

FIG. 9 is a timing diagram illustrating the operation of semiconductor device 500 of FIG. 5 according to an embodiment of the inventive concept. The timing diagram of FIG. 9 will be explained with reference to FIGS. 5 through 9.

In the example of FIG. 9, it is assumed that a command CMD is a read command RD, an additive latency period AL is '4' cycles of clock signal CLK, and a CAS latency period CL is '5' cycles of clock signal CLK. Read command RD is received at a time t2, and internal command generation unit 510 outputs an internal command CMD_INT and the memory device including semiconductor device 500 performs a read operation at a time t3 after four cycles of clock signal CLK starting from time t2. The memory device comprising semiconductor device 500 outputs data read during the read operation to a time t5 from a time t4 after five cycles of clock signal CLK from time t3.

Controller 520 generates control signal CON with the second logic state before time t2, with the first logic state from time t2 to time t5, and with the second logic state after time t5. Control signal CON is in the second logic state at time t1 in an activation period, and is changed from the second logic state to the first logic state in additive latency period AL from time t2 to time t3.

Where controller 520 is embodied as illustrated in FIG. 7, control signal CON can have the timing shown in FIG. 9. Accordingly, second OR gate 750 of controller 520 can perform an OR operation on an output signal of first OR gate 710 and all output signals of the respective delay units 730_1 through 730_p, and thus, control signal CON changes from the second logic state to the first logic state at time t2 as illustrated in FIG. 9. Where second OR gate 750 performs the OR operation on only the output signals of the respective delay units 730_3 through 730_p, control signal CON changes from the second logic state to the first logic state after three cycles of clock signal CLK starting from time t2. Accordingly, second OR gate 750 can control a time when control signal CON is changed from the second logic state to the first logic state by selecting signals on which the OR operation is to be performed.

Control signal CON maintains the first logic state from time t2 to time t5, and maintains the second logic state at other points of time. Accordingly, phase controller 530, latency controller 540, and command execution controller 550 are enabled from time t2 to time t5, and are disabled at other points of time. Although controller 520, as illustrated in FIG. 5, controls phase controller 530, latency controller 540, and command execution controller 550 using only control signal CON, controller 520 in other embodiments can control these elements individually by using multiple independent control signals.

In the embodiment of FIG. 9, one or more of phase controller 530, latency controller 540, and command execution controller 550 can remain disabled even where semiconductor device 500 is activated. These elements can then be enabled at the predetermined time in additive latency period AL. By selectively disabling these elements, power consumption is reduced.

Figure 10:
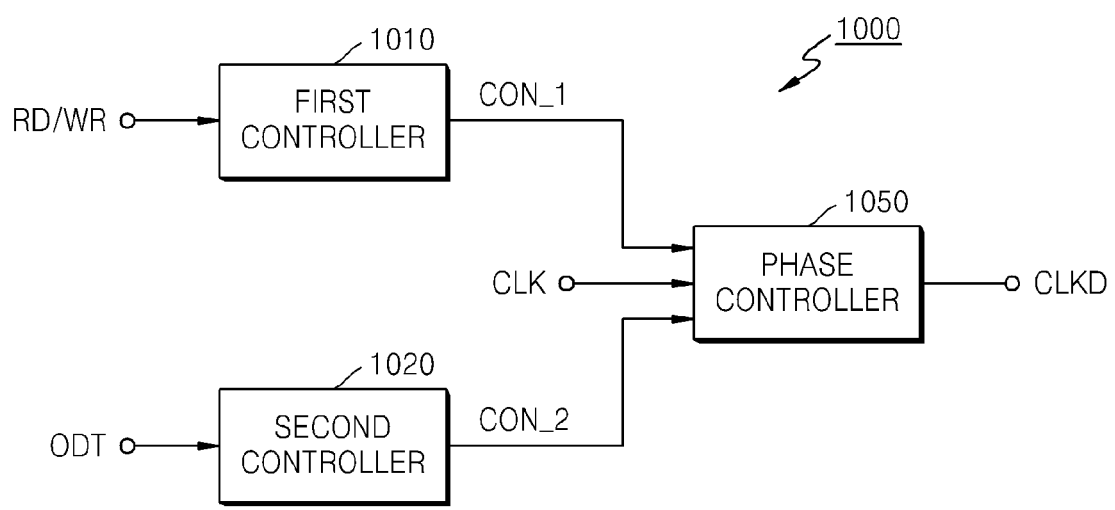
FIG. 10 is a block diagram of a semiconductor device according to another embodiment of the inventive concept.

FIG. 10 is a block diagram of a semiconductor device 1000 according to another embodiment of the inventive concept. Referring to FIG. 10, semiconductor device 1000 comprises a first controller 1010, a second controller 1020, and a phase controller 1050.

First controller 1010 generates and outputs a first control signal CON_1 to enable phase controller 1050 at a predetermined time in an additive latency period AL. More specifically, first controller 1010 generates and outputs first control signal CON_1 with the first logic level to enable phase controller 1050 from the predetermined time until completion of an operation corresponding to a received read command RD or write command WR, and generates and outputs first control signal with the second logic state to disable phase controller 1050 at other points of time. An embodiment of first controller 1010 will be described in further detail with reference to FIGS. 11 and 13.

Second controller 1020 generates and outputs a second control signal CON_2 with the second logic level to enable phase controller 1050 between the predetermined time in additive latency period AL and completion of an operation corresponding to an ODT command ODT, and generates and outputs second control signal CON_2 with the first logic level at different other times to disable phase controller 1050. An embodiment of second controller 1020 will be described in further detail with reference to FIGS. 12 and 13.

Phase controller 1050 generates a phase-controlled clock signal CLKD by controlling the phase of clock signal CLK. Phase controller 1050 is enabled or disabled according to first control signal CON_1 or second control signal CON_2. The structure of phase controller 1050 is the same as or similar to that of phase controller 150 of FIG. 3A or 3B.

Figure 11:
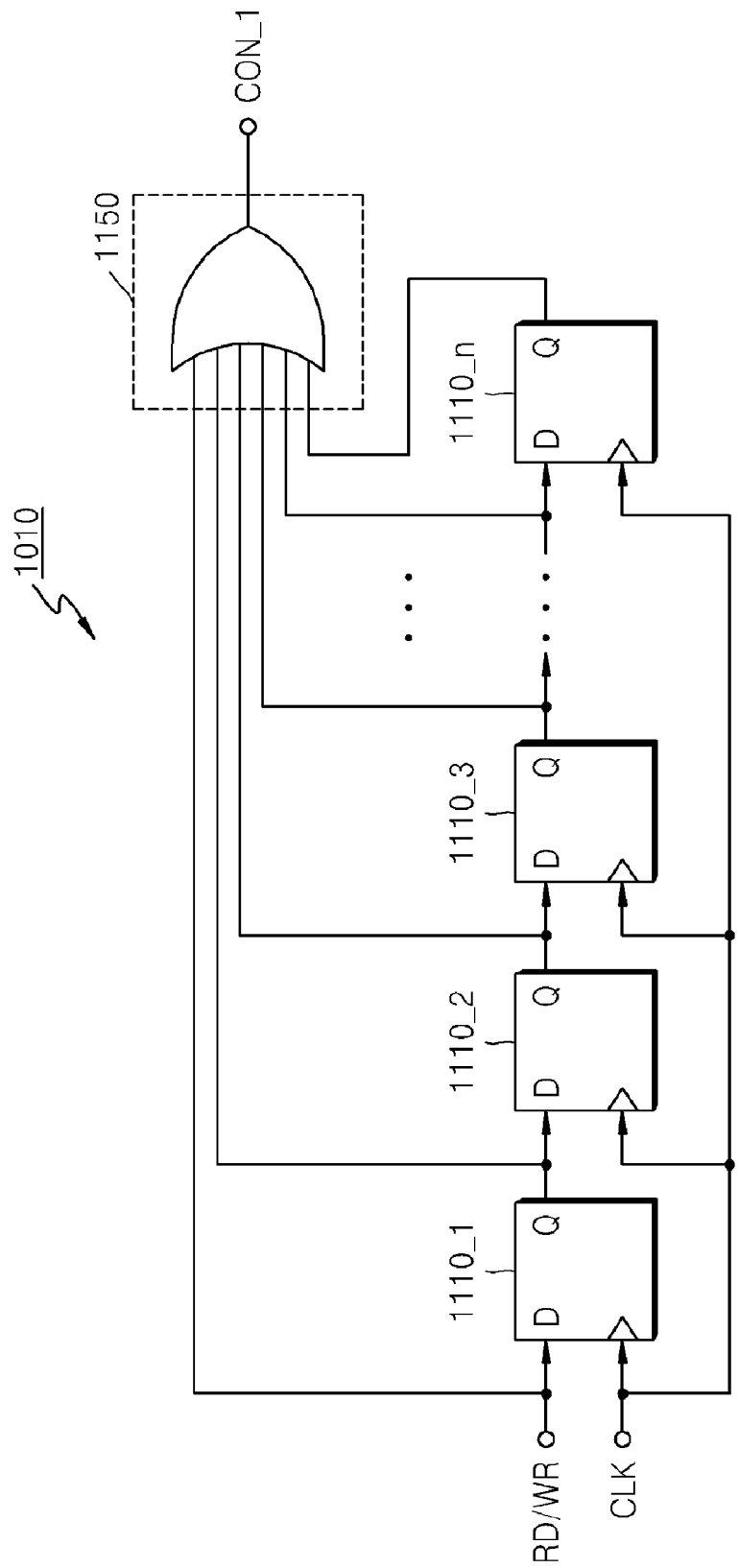
FIG. 11 is a circuit diagram of a first controller in the semiconductor device of FIG. 10 according to an embodiment of the inventive concept.

FIG. 11 is a circuit diagram of first controller 1010 in semiconductor device 1000 according to an embodiment of the inventive concept. In the embodiment of FIG. 11, first controller 1010 comprises "n" first delay units 1110_1 through 1110_n, and a first OR gate 1150, where "n" is a natural number.

First delay units 1110_1 through 1110_n are connected in series, and first delay unit 1110_1 receives, delays, and outputs read command RD or write command WR according to clock signal CLK. Each of first delay units 1110_2 through 1110_n delays and outputs an output signal of a preceding delay unit according to clock signal CLK. First OR gate 1150 receives at least two signals selected from among read command RD or write command WR, and the output signals of respective first delay units 1110_1 through 1110_n, performs an OR operation on the at least two output signals, and outputs first control signal CON_1 as a result of the OR operation.

Figure 12:
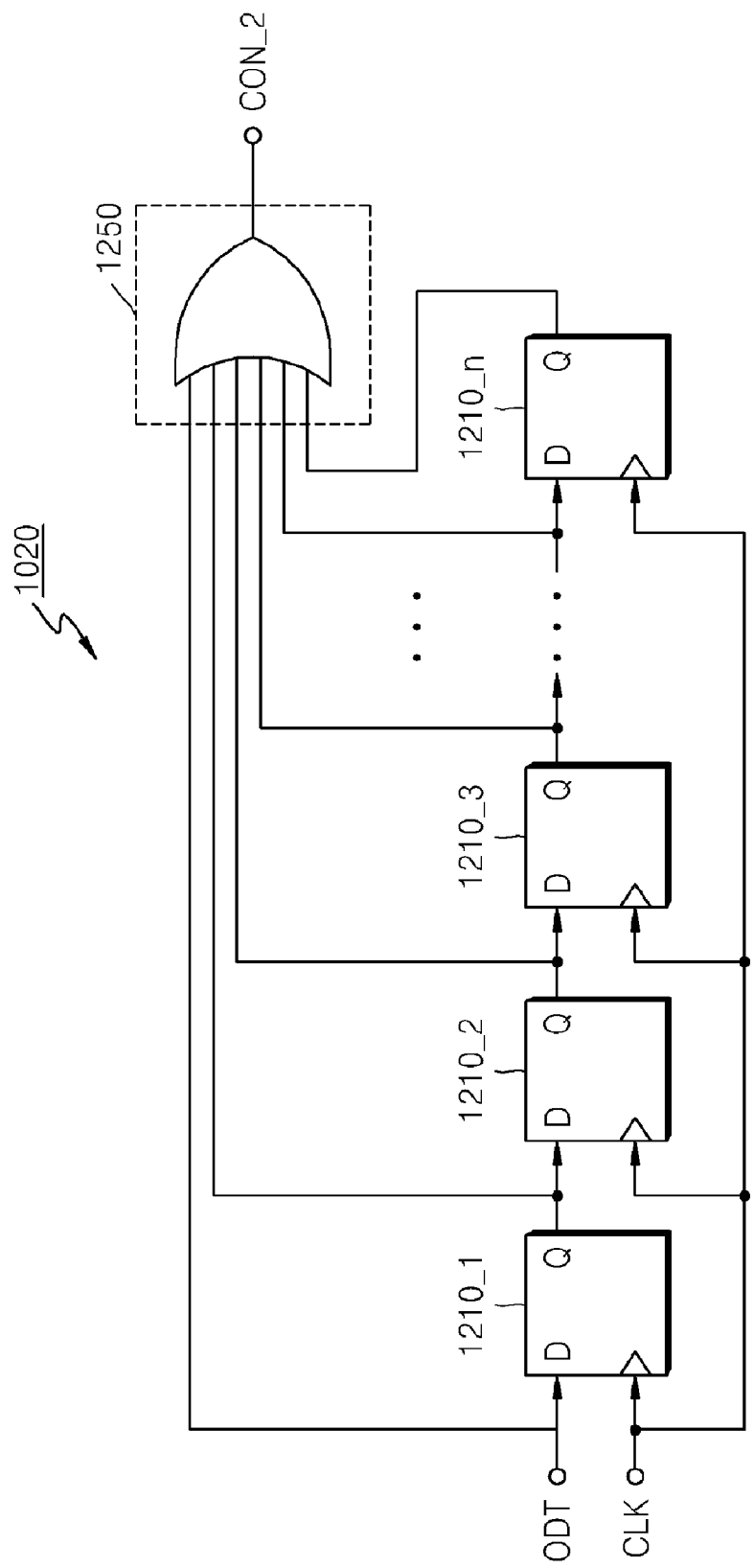
FIG. 12 is a circuit diagram of a second controller in the semiconductor device of FIG. 10 according to an embodiment of the inventive concept.

FIG. 12 is a circuit diagram of second controller 1020 in semiconductor device 1000 according to an embodiment of the inventive concept. Referring to FIGS. 10 and 12, second controller 1020 comprises "n" second delay units 1210_1 through 1210_n, and a second OR gate 1250, where "n" is a natural number.

Second delay units 1210_1 through 1210_n are connected in series, and second delay unit 1210_1 delays and outputs a received ODT command ODT according to clock signal CLK. Each of second delay units 1210_2 through 1210_n delays and outputs an output signal of a preceding delay unit according to clock signal CLK. Second OR gate 1250 receives at least two signals selected from among ODT command ODT and the output signals of respective second delay units 1210_1 through 1210_n, performs an OR operation on the at least two output signals, and outputs second control signal CON_2 as a result of the OR operation.

In the embodiment of FIG. 11, first control signal CON_1 is generated by performing the OR operation on all the output signals of the respective first delay units 1110_1 through 1110_n. However, in other embodiments, first control signal CON_1 can be generated by performing the OR operation on at least two signals selected from among the read/write command RD/WR and the output signals of the respective first delay units 1110_1 through 1110_n. Similarly, in the embodiment of FIG. 12, second control signal CON_2 is generated by performing the OR operation on all the output signals of the respective second delay units 1210_1 through 1210_n. However, in other embodiments, second control signal CON_2 can be generated by performing the OR operation on at least two signals selected from among ODT command ODT and the output signals of the respective second delay units 1210_1 through 1210_n.

Also, in the embodiment of FIG. 11, first controller 1010 generates first control signal CON_1 by delaying read command RD or write command WR. However, in other embodiments, first controller 1010 can generate first control signal CON_1 by using any other signal indicating a time when read command RD or write command WR is received. Similarly, in the embodiment of FIG. 12, second controller 1020 generates second control signal CON_2 by delaying ODT command ODT. However, in other embodiments, second controller 1020 can generate second control signal CON_2 using any other signal indicating a time when ODT command ODT is received.

In the embodiment of FIG. 12, first delay units 1110_1 through 1110_n and second delay units 1210_1 through 1210_n comprise flip flops. However, in other embodiments, first delay units 1110_1 through 1110_n and second delay units 1210_1 through 1210_n can comprise other devices capable of generating first control signal CON_1 or second control signal CON_2 with the logic states described above.

Figure 13:
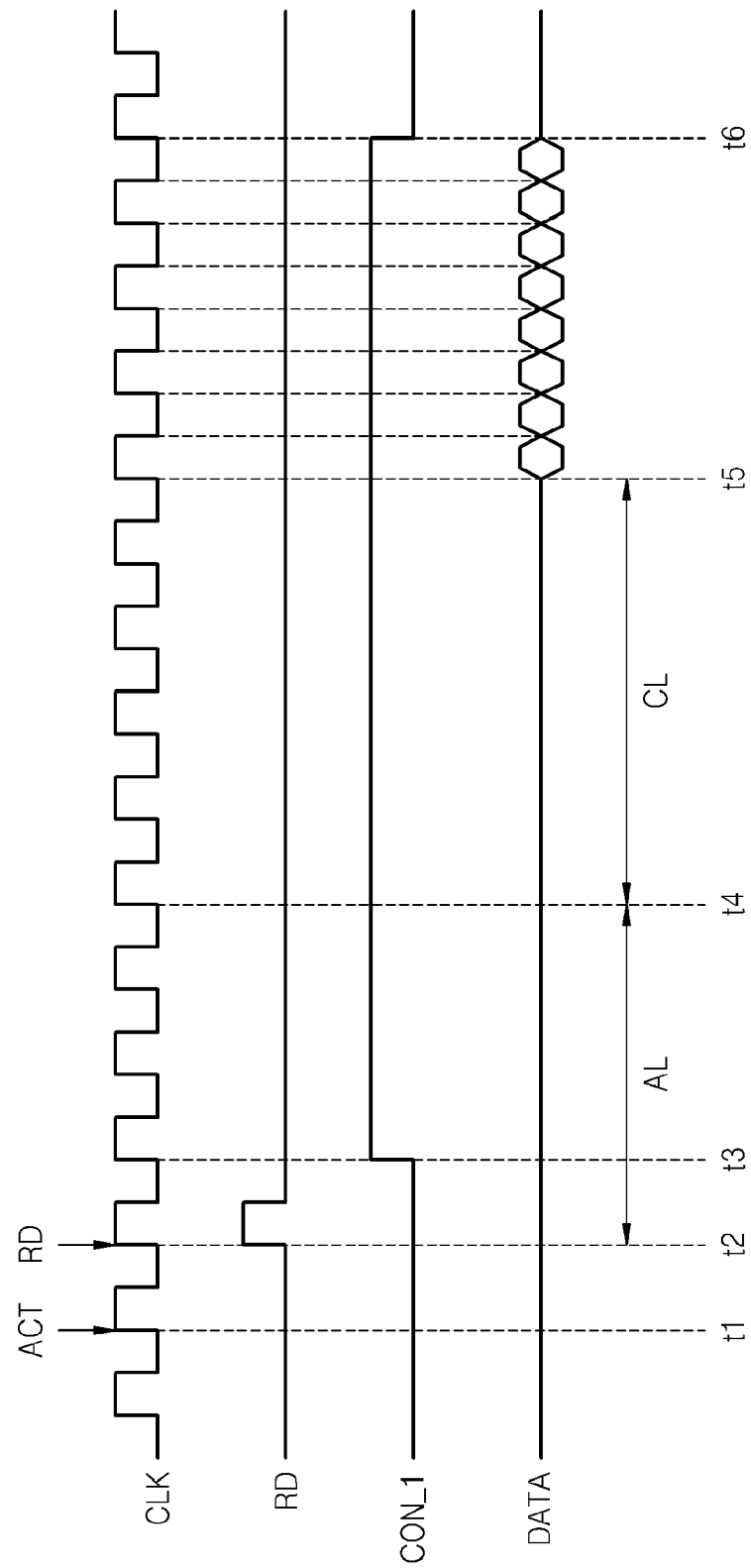
FIG. 13 is a timing diagram illustrating the operation of the semiconductor device of FIG. 10 according to an embodiment of the inventive concept.

FIG. 13 is a timing diagram illustrating the operation of semiconductor device 1000 of FIG. 10 according to an embodiment of the inventive concept. The timing diagram of FIG. 13 will be described with reference to FIGS. 10 through 13.

In the example of FIG. 13, it will be assumed that the memory device receives a read command RD, an additive latency period AL is '4' cycles of clock signal CLK, and a CAS latency period CL is '5' cycles of clock signal CLK. Read command RD is received at a time t2, and a memory device incorporating semiconductor device 1000 performs a read operation at a time t4 after four cycles of clock signal CLK starting from time t2. The memory device outputs data read during read operation RD between a time t5 and a time t6, where time t5 is five cycles of clock signal CLK after time t4.

First controller 1010 generates a first control signal CON_1 with the second logic state before time t3, with the first logic state from time t3 to time t6, and with the second logic state after time t6. First control signal CON_1 is in the second logic state at a time t1 in an activation period and is changed from the second logic state to the first logic state at time t3 in an additive latency period AL from time t2 to time t4.

Where first controller 1010 is embodied as illustrated in FIG. 11, first control signal CON_1 has the logic states illustrated in FIG. 13. In particular, first OR gate 1150 of first controller 1010 performs an OR operation on the output signals of first delay units 1110_1 through 1110_n, and thus, first control signal CON_1 is changed from the second logic state to the first logic state after one cycle of clock signal CLK starting from time t2, as illustrated in FIG. 13. On the other hand, where first OR gate 1150 performs the OR operation on read command RD and the output signals of respective first delay units 1110_1 through 1110_n, first control signal CON_1 is changed from the second logic state to the first logic state at time t2. Accordingly, first OR gate 1150 can be used to control a time when first control signal CON_1 is changed from the second logic state to the first logic state by selecting signals on which the OR operation is to be performed.

Because first control signal CON_1 is in the first logic state from time t3 to time t6, and is in the second logic state at other points of time, power consumption of semiconductor device 1000 can be reduced.

Because FIG. 13 illustrates a case where only read command RD is received, only first control signal CON_1 is changed from the second logic state to the first logic state in additive latency period AL. Where an ODT command ODT is received instead of read command RD, only second control signal CON_2 changes from the second logic state to the first logic state in additive latency period AL. Where both read command RD and ODT command ODT are received, both first control signal CON_1 and second control signal CON_2 change from the second logic state to the first logic state in additive latency period AL.

Figure 14:
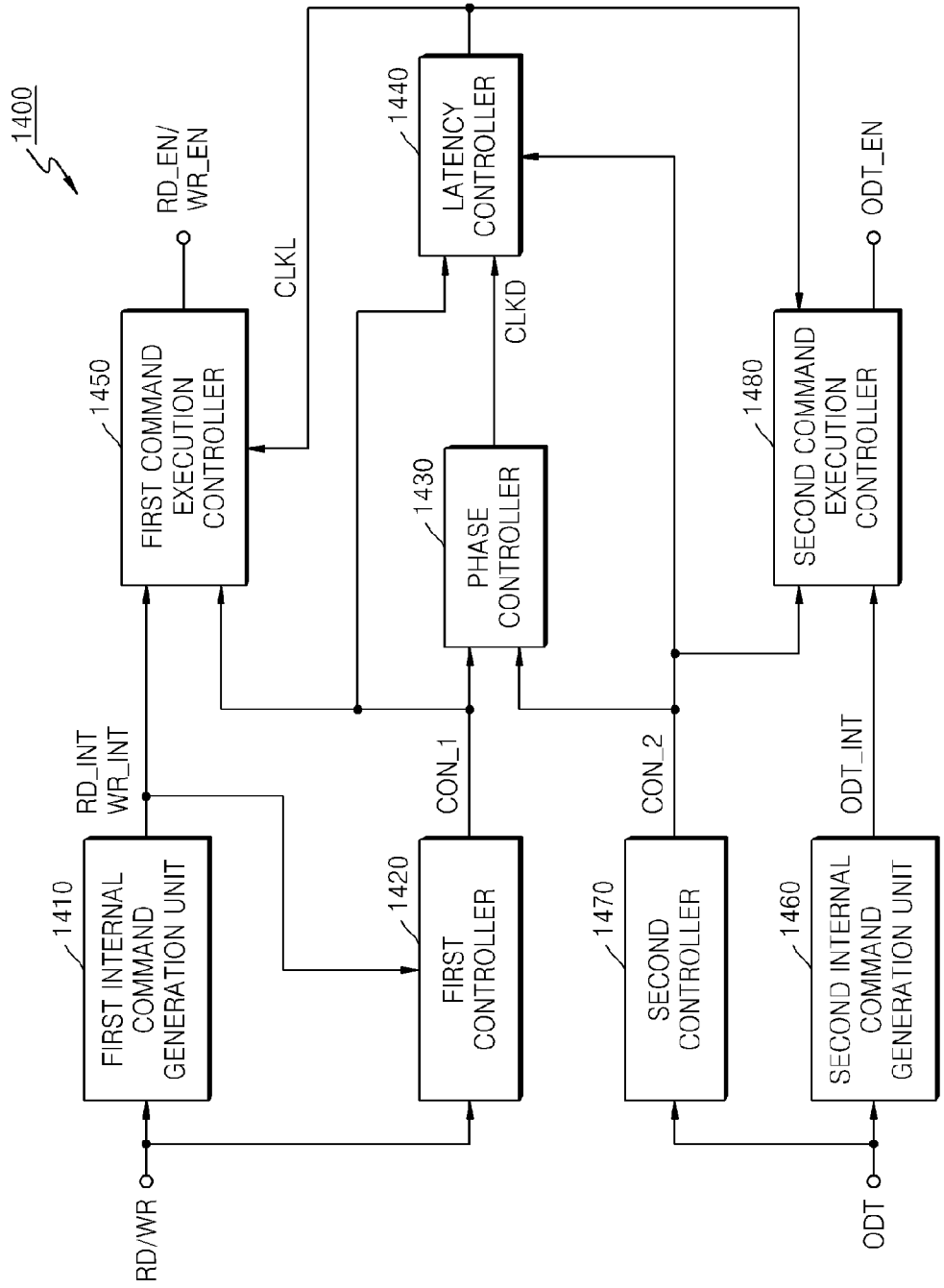
FIG. 14 is a block diagram of a semiconductor device according to another embodiment of the inventive concept.

FIG. 14 is a block diagram of a semiconductor device 1400 according to another embodiment of the inventive concept. In the embodiment of FIG. 14, semiconductor device 1400 comprises a first internal command generation unit 1410, a first controller 1420, a phase controller 1430, a latency controller 1440, a first command execution controller 1450, a second internal command generation unit 1460, a second controller 1470, and a second command execution controller 1480.

First internal command generation unit 1410 receives a read command RD or a write command WR, and generates and outputs an internal read command RD_INT or an internal write command WR_INT based on read command RD or write command WR at the end of an additive latency period AL period. An embodiment of first internal command generation unit 1410 will be described in further detail with reference to FIGS. 15 and 20.

First controller 1420 generates and outputs a first control signal CON_1 to enable phase controller 1430, latency controller 1440, or first command execution controller 1450 at a predetermined time in additive latency period AL. That is, first controller 1420 generates and outputs first control signal CON_1 with a first logic state to enable phase controller 1430, latency controller 1440, or first command execution controller 1450 from the predetermined time until a completion time of an operation corresponding to read command RD or write command WR, and generates and outputs first control signal CON_1 with a second logic state to disable the enabled phase controller 1430, latency controller 1440, or first command execution controller 1450 at other points of time. An embodiment of first controller 1420 will be described in further detail with reference to FIGS. 16 and 20.

Second internal command generation unit 1460 receives an ODT command ODT, and generates an internal ODT command ODT_INT based on ODT command ODT, and outputs internal ODT command ODT_INT upon completion of additive latency period AL. An embodiment of second internal command generation unit 1460 will be described in further detail with reference to FIGS. 17 and 20.

Second controller 1470 generates and outputs a second control signal CON_2 to enable phase controller 1430, latency controller 1440, or second command execution controller 1480 at a predetermined time in additive latency period AL. That is, second controller 1470 generates and outputs second control signal CON_2 with the first logic state with to enable phase controller 1430, latency controller 1440, and second command execution controller 1480 from the predetermined time to a completion time of an operation corresponding to ODT command ODT, and generates and outputs second control signal CON_2 with the second logic state to disable at least one of phase controller 1430, latency controller 1440, and second command execution controller 1480 at other points of time. An embodiment of second controller 1470 will be described in further detail with reference to FIGS. 18 and 20.

Phase controller 1430 generates a phase-controlled clock signal CLKD by controlling the phase of clock signal CLK, and supplies phase-controlled clock signal CLKD to latency controller 1440. Phase controller 1430 is enabled or disabled according to first control signal CON_1 or second control signal CON_2. The structure of phase controller 1430 is the same as or similar to that of phase controller 150 of FIG. 3A or 3B.

Latency controller 1440 generates a plurality of latency control signals CLKL from phase-controlled clock signal CLKD received from phase controller 1430 and supplies latency control signals CLKL to first command execution controller 1450 or second command execution controller 1480. Latency controller 1440 is enabled or disabled according to first control signal CON_1 or second control signal CON_2. An embodiment of latency controller 1440 will be described in further detail with reference to FIG. 19.

First command execution controller 1450 generates and outputs a read enable signal RD_EN to control the operation corresponding to read command RD based on internal read command RD_INT received from first internal command generation unit 1410 and latency control signals CLKL received from latency controller 1440. Also, first command execution controller 1450 generates and outputs a write enable signal WR_EN to control an operation corresponding to write command WR based on internal write command WR_INT received from first internal command generation unit 1410 and latency control signals CLKL received from latency controller 1440.

First command execution controller 1450 is enabled or disabled according to first control signal CON_1. For example, where read command RD is received, first command execution controller 1450 supplies read enable signal RD_EN to a data output buffer (not shown) of a memory device (not shown). The data output buffer outputs data read from a memory cell of the memory device via a data output pad (not shown) according to read enable signal RD_EN. An embodiment of first command execution controller 1450 will be described in further detail with reference to FIG. 19.

Second command execution controller 1480 generates and outputs an ODT enable signal ODT_EN to control the operation corresponding to ODT command ODT based on internal ODT command ODT_INT received from second internal command generation unit 1460 and latency control signals CLKL received from latency controller 1440. Second command execution controller 1480 is enabled or disabled according to second control signal CON_2. An embodiment of second command execution controller 1480 will be described in further detail with reference to FIG. 19.

Phase controller 1430, latency controller 1440, and first command execution controller 1450 are enabled according to first control signal CON_1 from a predetermined time in additive latency period AL to a completion time of the operation corresponding to read command RD or write command WR. At least one of phase controller 1430, latency controller 1440, and first command execution controller 1450 is disabled according to first control signal CON_1 upon completion of the operation corresponding to read command RD or write command WR, and is kept disabled even when the memory device including semiconductor device 1400 is activated.

Phase controller 1430, latency controller 1440, and second command execution controller 1480 are enabled according to second control signal CON_2 from a predetermined time in additive latency period AL to a completion time of the operation corresponding to ODT command ODT. At least one of phase controller 1430, latency controller 1440, and second command execution controller 1480 is disabled according to second control signal CON_2 upon completion of the operation corresponding to ODT command ODT, and is kept disabled even when the memory device including semiconductor device 1400 is activated.

As indicated by the foregoing, phase controller 1430, latency controller 1440, first command execution controller 1450, or second command execution controller 1480 can be enabled according to first control signal CON_1 or second control signal CON_2 before the memory device including semiconductor device 1400 performs the operation corresponding to read command RD, write command WR, or ODT command ODT. Accordingly, the memory device including semiconductor device 1400 can normally perform operations corresponding to read command RD, write command WR, or ODT command ODT while minimizing power consumption.

Figure 15:
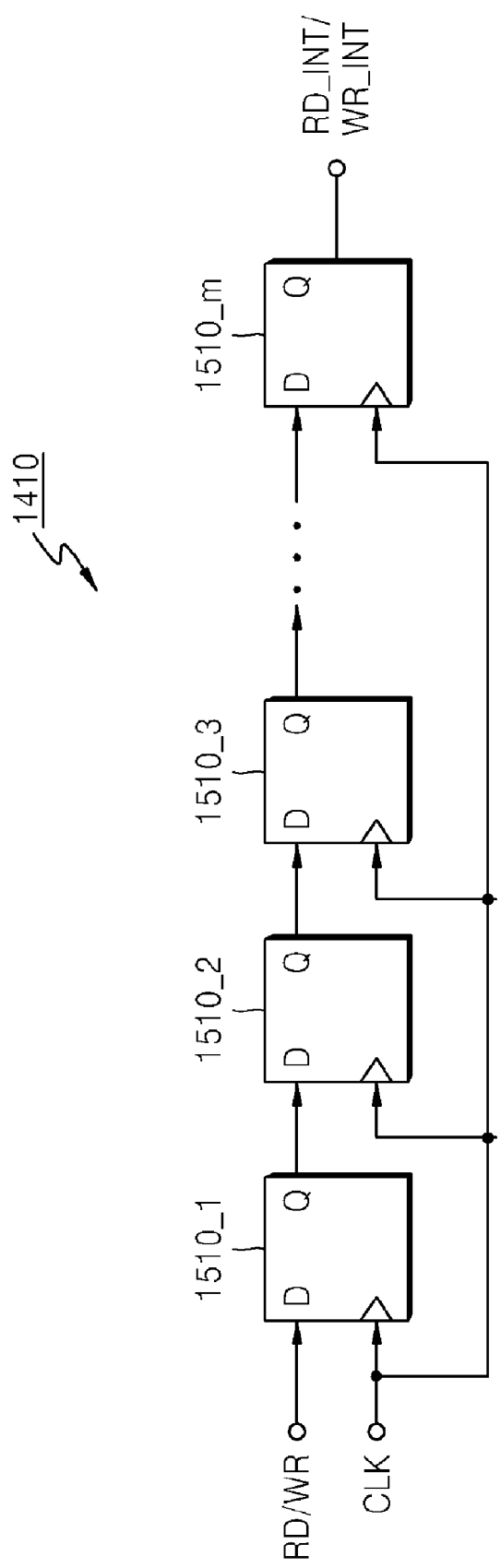
FIG. 15 is a circuit diagram of a first internal command generation unit in the semiconductor device of FIG. 14 according to an embodiment of the inventive concept.

FIG. 15 is a circuit diagram of first internal command generation unit 1410 in semiconductor device 1400 of FIG. 14 according to an embodiment of the inventive concept. Referring to FIGS. 14 and 15, first internal command generation unit 1410 comprises "m" first delay units 1510_1 through 1510_m, where "m" is a natural number. First delay units 1510_1 through 1510_m are connected in series, and first delay unit 1510_1 delays and outputs a received read command RD or write command WR according to clock signal CLK. Each of first delay units 1510_2 through 1510_m delays and outputs an output signal of a preceding delay unit according to clock signal CLK. For instance, read command RD or write command WR can be input sequentially to first delay units 1510_1 through 1510_m to be delayed for a predetermined time, and an internal read command RD_INT or an internal write command WR_INT is output as the delayed result.

Figure 16:
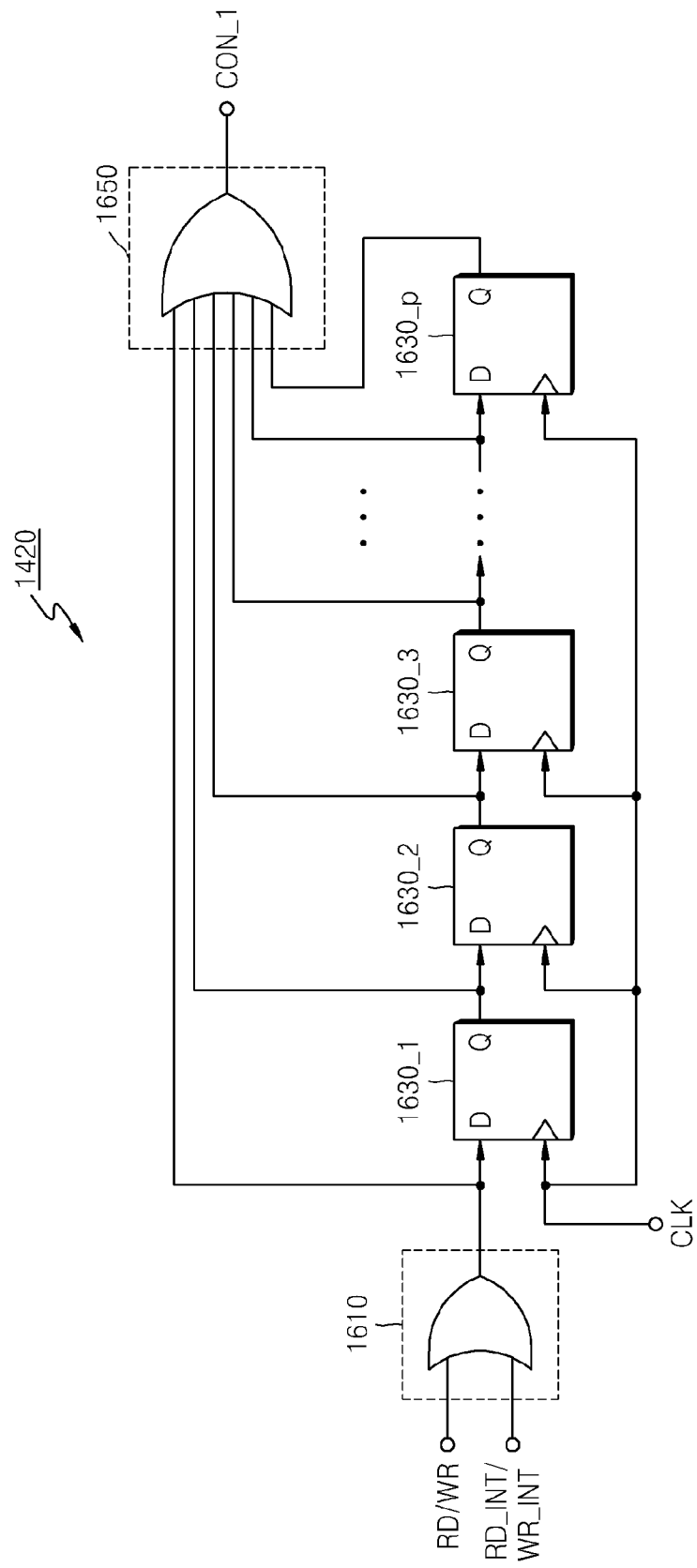
FIG. 16 is a circuit diagram of a first controller in the semiconductor device of FIG. 14 according to an embodiment of the inventive concept.

FIG. 16 is a circuit diagram of first controller 1420 in semiconductor device 1400 of FIG. 14 according to an embodiment of the inventive concept. Referring to FIGS. 14 and 16, first controller 1420 comprises a first OR gate 1610, "p" second delay units 1630_1 through 1630_p, and a second OR gate 1650, where "p" is a natural number.

First OR gate 1610 performs an OR operation on a received read command RD and internal read command RD_INT or may perform the OR operation on a received write command WR and internal write command WR_INT. Second delay units 1630_1 through 1630_p are connected in series, and second delay unit 1630_1 delays and outputs an output signal of first OR gate 1610 according to clock signal CLK. Each of second delay units 1630_2 through 1630_p delays and outputs the output signal of a preceding delay unit according to clock signal CLK. Second OR gate 1650 receives at least two signals selected from among the output signal of first OR gate 1610 and the output signals of respective second delay units 1630_1 through 1630_p, performs the OR operation on the at least two output signals, and outputs a first control signal CON_1 as a result of the OR operation.

In the embodiment of FIG. 16, first control signal CON_1 is generated by performing the OR operation on all the output signals of the respective second delay units 1630_1 through 1630_p. However, in other embodiments, first control signal CON_1 can be generated by performing the OR operation at least two signals selected from among on the read/write command RD/WR and the output signals of the respective second delay units 1630_1 through 1630_p. Also, in the embodiment of FIG. 16, first controller 1420 generates first control signal CON_1 by delaying read command RD or write command WR. However, in other embodiments, first controller 1420 can generate first control signal CON_1 using any other signal indicating a time when read command RD or write command WR is received.

In the embodiment of FIG. 16, second delay units 1630_1 through 1630_p comprise flip flops. However, in other embodiments, second delay units 1630_1 through 1630_p can comprise other devices capable of generating first control signal CON_1 with the logic states described above.

Figure 17:
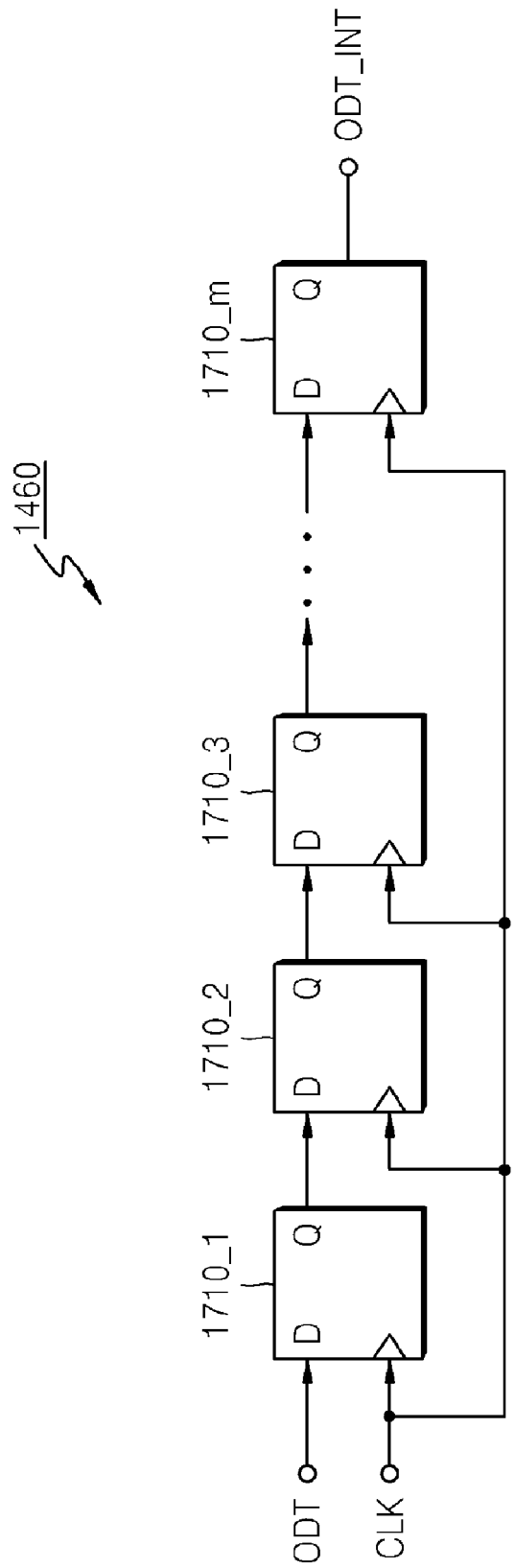
FIG. 17 is a circuit diagram of a second internal command generation unit in the semiconductor device of FIG. 14 according to an embodiment of the inventive concept.

FIG. 17 is a circuit diagram of second internal command generation unit 1460 in semiconductor device 1400 of FIG. 14 according to an embodiment of the inventive concept. Referring to FIGS. 14 and 17, second internal command generation unit 1460 comprises "m" third delay units 1710_1 through 1710_m, where "m" is a natural number. Third delay units 1710_1 through 1710_m are connected in series, and third delay unit 1710_1 delays and outputs a received ODT command ODT according to clock signal CLK. Each of third delay units 1710_2 through 1710_m delays and outputs an output signal of a preceding delay unit thereof according to clock signal CLK. That is, ODT command ODT is input sequentially to third delay units 1710_1 through 1710_m to be delayed for a predetermined time, and an internal ODT command ODT_INT is output as the delayed result.

Figure 18:
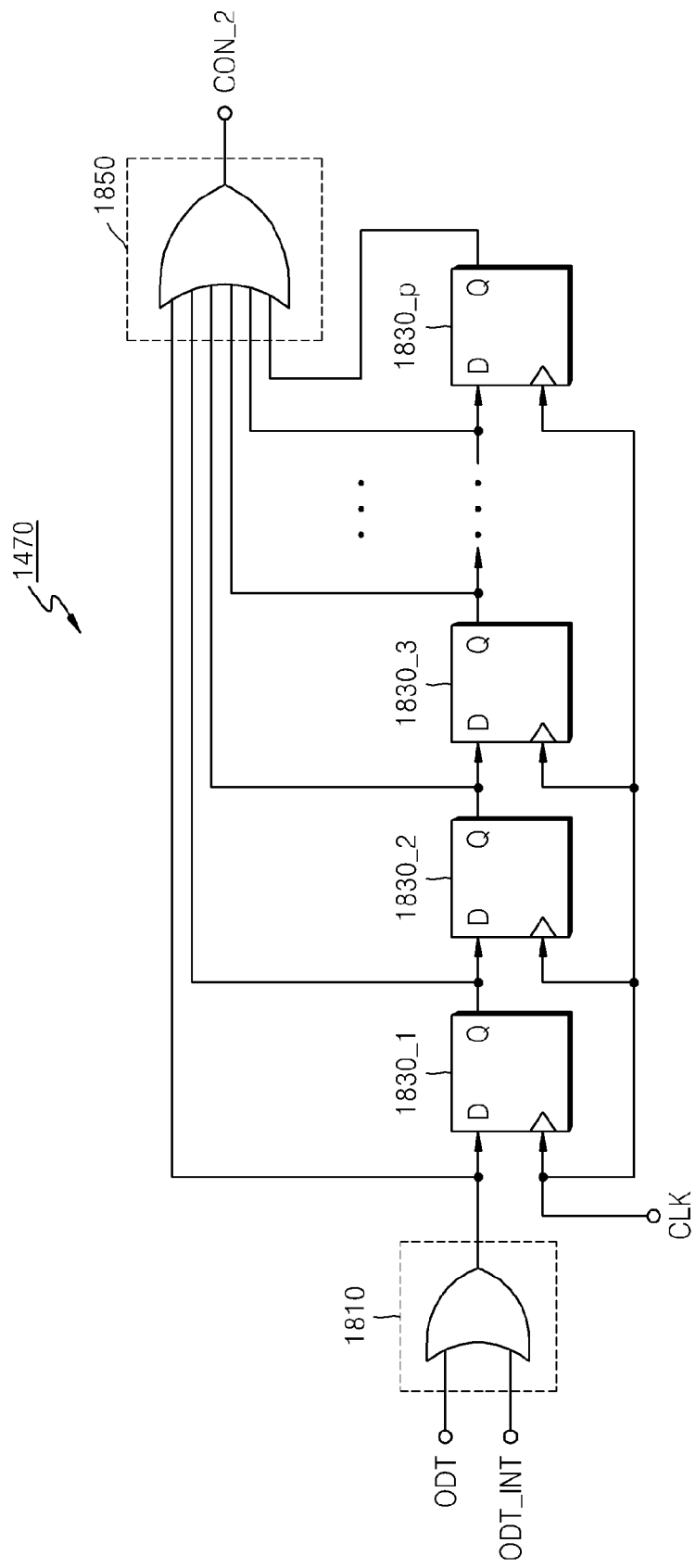
FIG. 18 is a circuit diagram of a second controller in the semiconductor device of FIG. 14 according to an embodiment of the inventive concept.

FIG. 18 is a circuit diagram of second controller 1470 in semiconductor device 1400 of FIG. 14 according to an embodiment of the inventive concept. Referring to FIGS. 14 and 18, second controller 1470 comprises a third OR gate 1810, "p" fourth delay units 1830_1 through 1830_p, and a fourth OR gate 1850, where "p" is a natural number.

Third OR gate 1810 performs an OR operation on ODT command ODT and internal ODT command ODT_INT. Fourth delay units 1830_1 through 1830_p are connected in series, and fourth delay unit 1830_1 delays and outputs an output signal of third OR gate 1810 according to clock signal CLK. Each of fourth delay units 1830_2 through 1830_p delays and outputs an output signal of a preceding fourth delay unit according to clock signal CLK. Fourth OR gate 1850 receives at least two signals of the output signal of third OR gate 1810 and the output signals of the respective fourth delay units 1830_1 through 1830_p, performs an OR operation the at least two signals, and outputs a second control signal CON_2 as a result of the OR operation.

In the embodiment of FIG. 18, second control signal CON_2 is generated by performing the OR operation on all the output signals of the respective fourth delay units 1830_1 through 1830_p. However, in other embodiments, second control signal CON_2 can be generated by performing the OR operation on at least two output signals of ODT command ODT and the output signals of the respective fourth delay units 1830_1 through 1830_p. Also in the embodiment of FIG. 18, second controller 1470 generates second control signal CON_2 by delaying ODT command ODT. However, in other embodiments, second controller 1470 can generate second control signal CON_2 by using another signal indicating a time when ODT command ODT is received. Also, in the embodiment of FIG. 18, the fourth delay units 1830_1 through 1830_p comprise flip flops. However, in other embodiments, fourth delay units 1830_1 through 1830_p can comprise other devices capable of generating second control signal CON_2 with the logic state described above.

Figure 19:
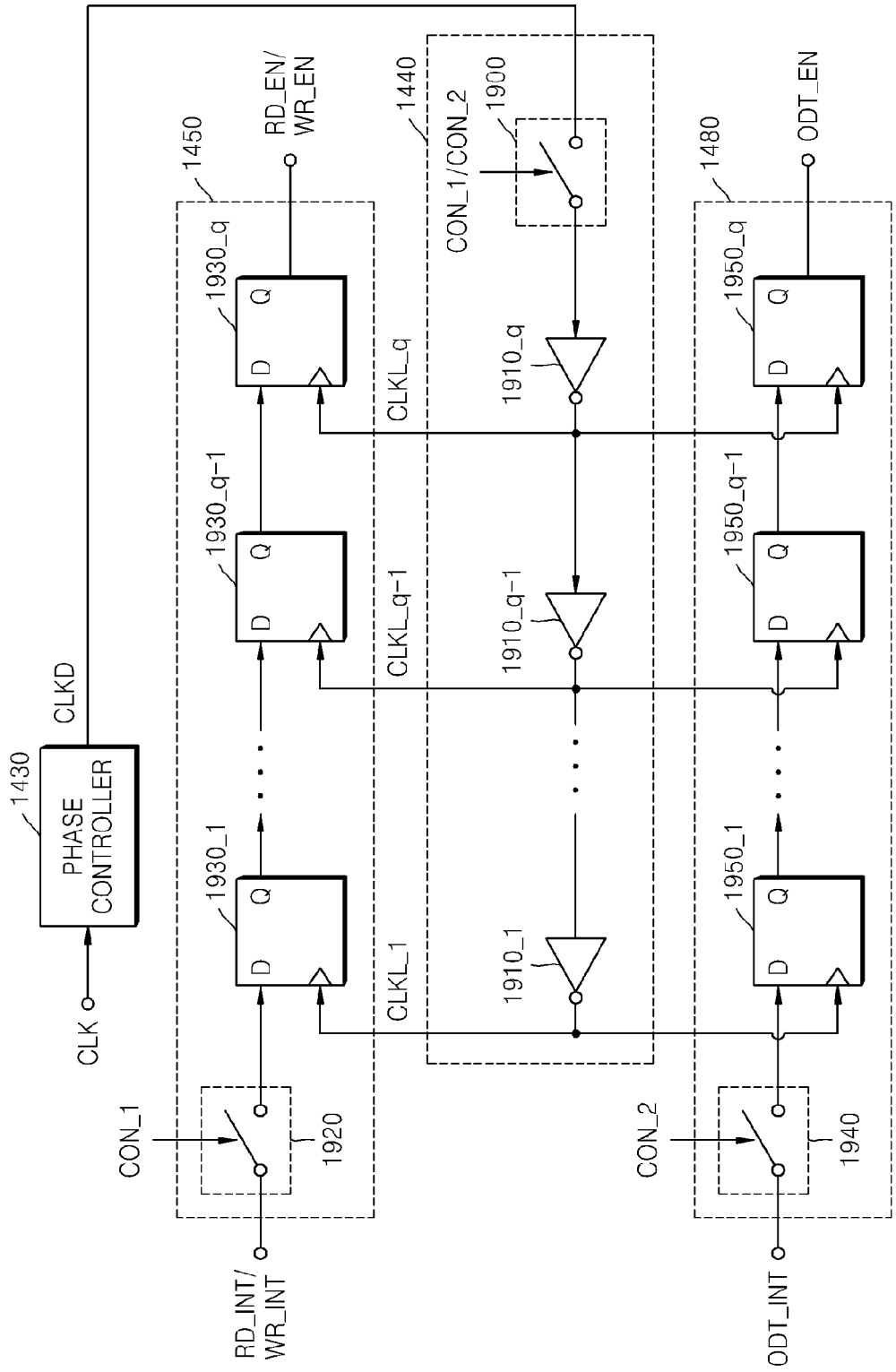
FIG. 19 is a circuit diagram of a phase controller, a latency controller, a first command execution controller, and a second command execution controller in the semiconductor device of FIG. 14 according to an embodiment of the inventive concept.

FIG. 19 is a circuit diagram of phase controller 1430, latency controller 1440, first command execution controller 1450, and second command execution controller 1480 in semiconductor device 1400 of FIG. 14, according to an embodiment of the inventive concept.

Referring to FIGS. 14 and 19, phase controller 1430 outputs a phase-controlled clock signal CLKD by controlling the phase of clock signal CLK. The structure of phase controller 1430 can be the same as or similar to that of phase controller 150 of FIG. 3A or 3B.

Latency controller 1440 comprises a first connection unit 1900 and "q", and fifth delay units 1910_1 through 1910_q, where "q" is a natural number. First connection unit 1900 transmits phase-controlled clock signal CLKD or blocks the transmission of phase-controlled clock signal CLKD to fifth delay unit 1910_q according to first control signal CON_1 or second control signal CON_2. More specifically, first connection unit 1900 transmits phase-controlled clock signal CLKD to fifth delay unit 1910_q where first or second control signal CON_1 or CON_2 is in the first logic state and blocks the transmission of phase-controlled clock signal CLKD to fifth delay unit 1910_q where first or second control signal CON_1 or CON_2 is in the second logic state.

Fifth delay units 1910_1 through 1910_q are connected in series, and fifth delay unit 1910_q outputs a latency control signal CLKL_q by delaying phase-controlled clock signal CLKD. Fifth delay units 1910_1 through 1910_q−1 delay preceding delay units and output corresponding latency control signals CLKL_1 through CLKL_q−1.

First command execution controller 1450 comprises a second connection unit 1920 and "q" sixth delay units 1930_1 through 1930_q. Second connection unit 1920 facilitates or blocks transmission of an internal read command RD_INT or an internal write command WR_INT to sixth delay unit 1930_1 according to first control signal CON_1. More specifically, second connection unit 1920 transmits internal read command RD_INT or internal write command WR_INT to sixth delay unit 1930_1 where first control signal CON_1 is in the first logic state, and blocks the transmission of internal read command RD_INT or internal write command WR_INT to sixth delay unit 1930_1 where first control signal CON_1 is in the second logic state.

Sixth delay units 1930_1 through 1930_q are connected in series, and sixth delay unit 1930_1 delays and outputs internal read command RD_INT or internal write command WR_INT according to a latency control signal CLKL_1 received from fifth delay unit 1910_1. Sixth delay units 1930_2 through 1930_q delay and output the output signals of preceding delay units according to corresponding latency control signals CLKL_2 through CLKL_q. That is, in first command execution controller 1450, internal read command RD_INT or internal write command WR_INT is input sequentially to the sixth delay units 1930_1 through 1930_q to be delayed for a predetermined time, and a read enable signal RD_EN or a write enable signal WR_EN is output as the delayed result.

Second command execution controller 1480 comprises a third connection unit 1940 and "q" seventh delay units 1950_1 through 1950_q. Third connection unit 1940 facilitates or blocks transmission of an internal ODT command ODT_INT to seventh delay unit 1950_1 according to second control signal CON_2. More specifically, third connection unit 1940 transmits internal ODT command ODT_INT to seventh delay unit 1950_1 where second control signal CON_2 is in the first logic state and blocks the transmission of internal ODT command ODT_INT to seventh delay unit 1950_1 where second control signal CON_2 is in the second logic state.

Seventh delay units 1950_1 through 1950_q are connected in series, and seventh delay unit 1950_1 delays and outputs internal ODT command ODT_INT according to latency control signal CLKL_1 received from fifth delay unit 1910_1. Seventh delay units 1950_2 through 1950_q delay and output the output signals of the preceding delay units according to corresponding latency control signals CLKL_2 through CLKL_q. That is, in second command execution controller 1480, internal ODT command ODT_INT is input sequentially to seventh delay units 1950_1 through 1950_q to be delayed for a predetermined time and then an ODT enable signal ODT_EN is output as the delayed result.

In the embodiment of FIG. 19, first connection unit 1900, second connection unit 1920, and third connection unit 1940 comprise switches that switch on or off according to first control signal CON_1 and second control signal CON_2, respectively. However, in other embodiments, first connection unit 1900, second connection unit 1920 and third connection unit 1940 can comprise other devices, such as transistors, that are capable of enabling or disabling latency controller 1440, first command execution controller 1450, or second command execution controller 1480 according to the logic state of the first or second control signal CON_1 or CON_2.

In the embodiment of FIG. 19, first connection unit 1900 facilitates or blocks transmission of phase-controlled clock signal CLKD. However, in other embodiments, first connection unit 1900 can facilitate or block transmission of phase-controlled clock signal CLKD among the fifth delay units 1910_1 through 1910_q. Similarly, although FIG. 19 illustrates a case where the second connection unit 1920 transmits or blocks transmission of the internal read command RD_INT or internal write command WR_INT, second connection unit 1920 could alternatively transmit or block transmission of internal read command RD_INT or internal write command WR_INT among the sixth delays units 1930_1 through 1930_q or may transmit or block transmission of some or all latency control signals CLKL_1 through CLKL_q among the fifth delay units 1910_1 through 1910_q and the sixth delay units 1930_1 through 1930_q.

In the embodiment of FIG. 19, third connection unit 1940 transmits or blocks transmission of internal ODT command ODT_INT. However, in other embodiments, third connection unit 1940 can facilitate or block the transmission of internal ODT command ODT_INT among seventh delay units

1950_1 through 1950_*q* or facilitate or block transmission of some or all latency control signals CLKL_1 through CLKL_*q* among fifth delay units 1910_1 through 1910_*q* and seventh delay units 1950_1 through 1950_*q*.

In the embodiment of FIG. 19, fifth delay units 1910_1 through 1910_*q* comprise inverters and sixth delay units 1930_1 through 1930_*q* and seventh delay units 1950_1 through 1950_*q* comprise flip flops. However, in other embodiments, the inverters and flip flops can be substituted with other devices capable of generating the above-described latency control signals CLKL_1 through CLKL_q, read enable signal RD_EN, write enable signal WR_EN, or ODT enable signal ODT_EN.

Figure 20:
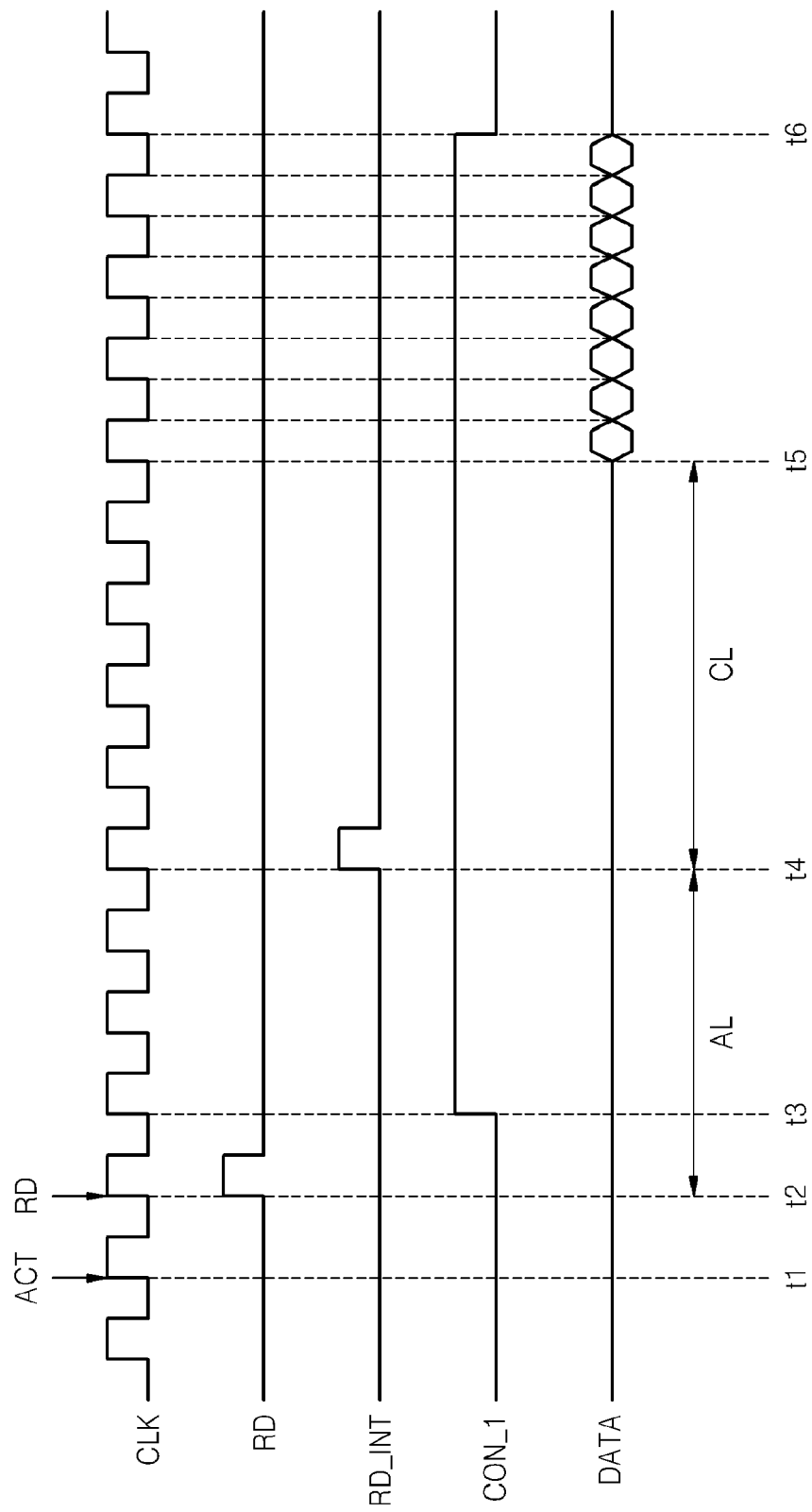
FIG. 20 is a timing diagram illustrating the operation of the semiconductor device of FIG. 14 according to an embodiment of the inventive concept.

FIG. 20 is a timing diagram illustrating the operation of semiconductor device 1400 of FIG. 14 according to an embodiment of the inventive concept. The timing diagram of FIG. 20 is described below with reference to FIGS. 14 to 20.

In the example of FIG. 20, it is assumed that only a read command RD is received, an additive latency period AL is '4' cycles of clock signal CLK, and a CAS latency period CL is '5' cycles of clock signal CLK. Read command RD is received at a time t2, and the memory device incorporating semiconductor device 1400 of FIG. 14 performs a read operation at a time t4 after four cycles of clock signal CLK starting from time t2. The memory device incorporating semiconductor device 1400 outputs data read during the read operation to a time t6 from a time t5 after five cycles of clock signal CLK starting from time t4.

First controller 1420 generates a first control signal CON_1 with the second logic state before a time t3, with the first logic state from time t3 to time t6, and with the second logic state after time t6. First control signal CON_1 is in the second logic state at a time t1 in an activation period, and is changed from the second logic state to the first logic state at time t3 in an additive latency period AL from time t2 to time t4.

Where first controller 1420 is embodied as illustrated in FIG. 16, first control signal CON_1 can have the logic states illustrated in FIG. 20. For instance, referring to FIG. 16, second OR gate 1650 of first controller 1420 can perform an OR operation on output signals of the respective second delay units 1630_1 through 1630_*n* to change first control signal CON from the second logic state to the first logic state after one cycle of clock signal CLK, as illustrated in FIG. 20. On the other hand, where second OR gate 1650 performs the OR operation on all read command RD and the output signals of the respective second delay units 1630_1 through 1630_*n*, first control signal CON_1 changes from the second logic state to the first logic state at time t2. Accordingly, second OR gate 1650 can control a time when first control signal CON_1 is changed from the second logic state to the first logic state by selecting signals on which the OR operation is to be performed.

Because first control signal CON_1 maintains the first logic state from time t3 to time t6 when outputting of the read data ends, and maintains the second logic state at other points of time, phase controller 1430, latency controller 1440, and first command execution controller 1450 are enabled from time t3 to time t6 and are disabled at other points of time. In the embodiment of FIG. 14, first controller 1420 controls phase controller 1430, latency controller 1440, and first command execution controller 1450 using only first control signal CON_1. However, in other embodiments, first controller 1420 could control these elements using a plurality of independent control signals.

Because FIG. 20 illustrates a case where only read command RD is received, only first control signal CON_1 is changed from the second logic state to the first logic state in additive latency period AL. Where an ODT command ODT is received instead of read command RD, only second control signal CON_2 can be changed from the second logic state to the first logic state in additive latency period AL. Where both read command RD and ODT command ODT are received, both first control signal CON_1 and second control signal CON_2 can be changed from the second logic state to the first logic state in additive latency period AL.

In the embodiment of FIG. 20, even where semiconductor device 1400 is activated, at least one device selected from the group consisting of phase controller 1430, latency controller 1440, first command execution controller 1450, and second command execution controller 1480 is kept disabled except during the above described interval beginning in additive latency period AL. By disabling these elements as described, power consumption of semiconductor device 1400 can be reduced.

Figure 21:
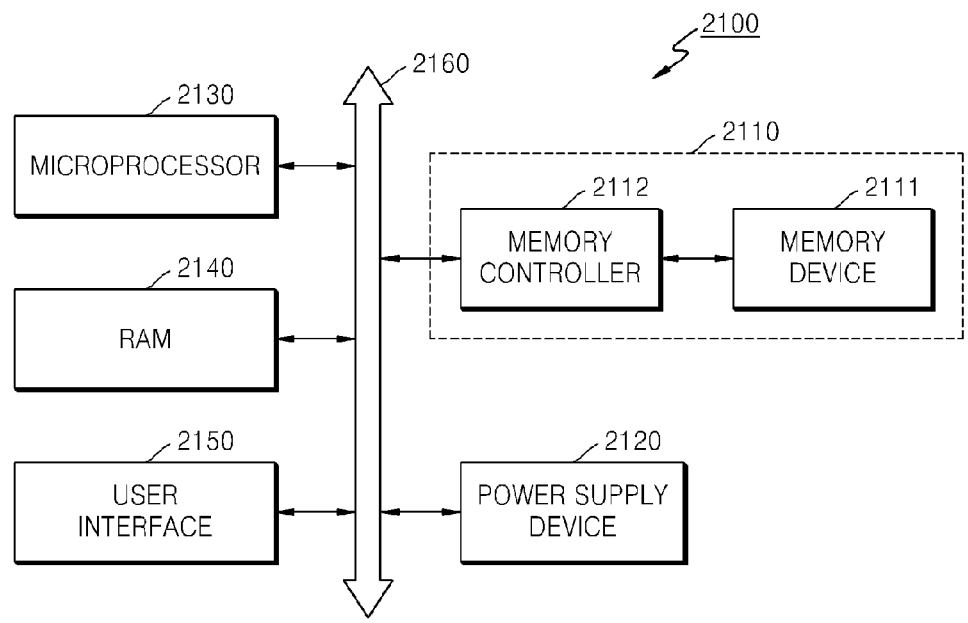
FIG. 21 is a block diagram of a computing system incorporating a semiconductor device according to an embodiment of the inventive concept.

FIG. 21 is a block diagram of a computing system 2100 incorporating a semiconductor device according to an embodiment of the inventive concept. Referring to FIG. 21, computing system 2100 comprises a microprocessor 2130, a user interface unit 2150, and a memory system device 2110 comprising a memory controller 2112 and a memory device 2111 that are electrically connected to a bus 2160.

Memory device 2111 comprises a plurality of memory cells for storing data. Memory device 2111 comprises a semiconductor device according to one of the embodiments presented with reference to FIGS. 1 to 20. Memory controller 2112 controls memory device 2111. Computing system 2100 further comprises a random access memory (RAM) 2140 and a power supply device 2120.

Where computing system 2100 is a mobile apparatus, computing system 2100 can further comprise a battery for supplying power thereto, and a modem, such as a baseband chipset. Also, computing system 2100 can further comprise other devices, such as an application chipset, a camera image sensor (CIS), and a mobile dynamic RAM (DRAM).

Memory controller 2112 and memory device 2111 can form, for instance, a solid state drive/disk (SSD) that uses non-volatile memory in order to store data.

Figure 22:
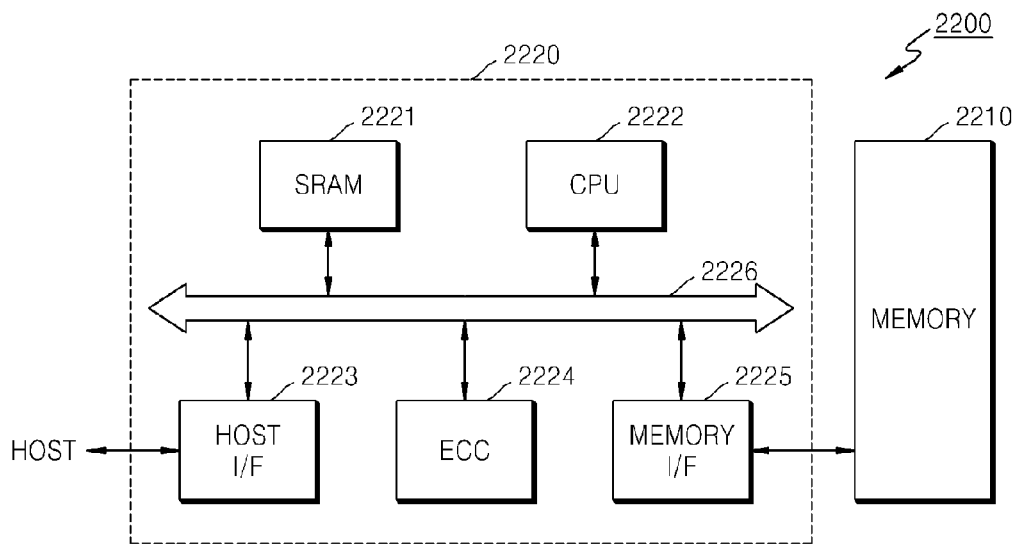
FIG. 22 is a block diagram of a memory card incorporating a semiconductor device according to an embodiment of the inventive concept.

FIG. 22 is a block diagram of a memory card 2200 comprising a semiconductor device according to an embodiment of the inventive concept. Referring to FIG. 22, memory card 2200 comprises a memory device 2210 and a memory controller 2220. Memory device 2210 comprises a plurality of memory cells for storing data. Memory device 2210 comprises the semiconductor device according to one of the above embodiments of FIGS. 1 to 20. Memory controller 2220 controls memory device 2210. Memory controller 2220 can be constructed to communicate with an external device, such as a host, via one of various interface protocols, such as universal serial bus (USB), multi media card (MMC), peripheral component interconnect express (PCI-E), serial advanced technology attachment (SATA), parallel advanced technology attachment (PATA), small computer system interface (SCSI), enhanced small device interface (ESDI), or integrated device electronics (IDE).

The memory devices described above can be packaged using any of several types of packages. Examples package types include package on package (PoP), ball grid array (BGA), a chip scale package (CSP), a plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline integrated circuit (SOIC), shrink small outline package (SSOP), thin small outline package (TSOP), system in package (SIP), multi chip package (MCP), wafer-level fabricated package (WFP), and wafer-level processed stack package (WSP).

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A semiconductor device that receives a command and performs a corresponding memory access operation at the end of an additive latency period that starts when the command is received, the semiconductor device comprising:
a phase controller that controls a phase of a clock signal to generate a phase-controlled clock signal; and
a controller that generates a control signal with a first logic state to change the phase controller from a disabled state to an enabled state at a predetermined time in the additive latency period;
wherein the control signal is changed to the first logic state after at least one clock cycle passes after the additive latency period starts, and
wherein the controller changes the control signal to a second logic state to disable the phase controller after a completion time of the memory access operation.

2. The semiconductor device of claim 1, wherein the controller maintains the control signal in the first logic state during an interval between the predetermined time and the completion time of the memory access operation.

3. The semiconductor device of claim 1, wherein the phase controller comprises:
a delay-locked loop that controls the phase of the clock signal; and
a connection unit that facilitates or blocks transmission of the clock signal to the delay-locked loop according to the control signal.

4. The semiconductor device of claim 1, wherein the phase controller comprises:
a phase-locked loop that controls the phase of the clock signal; and
a connection unit that facilitates or blocks transmission of the clock signal to the phase-locked loop according to the control signal.

5. The semiconductor device of claim 1, wherein the command is a read command, a write command, or an on-die termination (ODT) command.

6. The semiconductor device of claim 1, wherein the controller comprises:
a plurality of delay units that are connected in series, and that delay and output the command according to the clock signal; and
an OR gate that performs an OR operation on at least two signals selected from among the command and output signals of the respective delay units, and outputs the control signal as a result of the OR operation.

7. The semiconductor device of claim 1, wherein the control signal enables the phase controller, the latency controller, and the command execution controller from the predetermined time until a completion time of the memory access operation, and disables at least one of the phase controller, the latency controller, and the command execution controller at other points of time.

8. The semiconductor device of claim 1, wherein the controller comprises:
a first OR gate that performs an OR operation on the command and the internal command;
a plurality of delay units that are connected in series, and that delay and output an output signal of the first OR gate according to the clock signal; and
a second OR gate that performs the OR operation on at least two signals selected from among the output signal of the first OR gate and output signals of the respective delay units, and that outputs the control signal as a result of the OR operation.

9. The semiconductor device of claim 1, wherein the internal command generation unit comprises a plurality of delay units that delay and output the command according to the clock signal.

10. The semiconductor device of claim 1, wherein the latency controller comprises:
a plurality of delay units that are connected in series, and that delay the output signal of the phase controller and output the respective latency control signals; and
a connection unit that controls a connection between the phase controller and the plurality of delay units or between the plurality of delay units, according to the control signal.

11. The semiconductor device of claim 1, wherein the command execution controller comprises:
a plurality of delay units that are connected in series, and that delay the internal command according to a corresponding one of the latency control signals; and
a connection unit that controls a connection between the latency controller and the plurality of delay units, between the internal command generation unit and the plurality of delay units, or between the plurality of delay units, according to the control signal.

12. A semiconductor device that receives a command and performs a corresponding memory access operation at the end of an additive latency period that starts when the command is received, the semiconductor device comprising:
a phase controller that controls a phase of a clock signal to generate a phase-controlled clock signal;
a controller that generates a control signal with a first logic state to change the phase controller from a disabled state to an enabled state at a predetermined time in the additive latency period;
a latency controller that generates a plurality of latency control signals based on the phase-controlled clock signal and outputs the latency control signals;
an internal command generation unit that outputs an internal command based on the command after the end of the additive latency period; and
a command execution controller that controls the memory access operation based on the internal command and the latency control signals;
wherein the control signal further enables all disabled units among the phase controller, the latency controller, and the command execution controller at the predetermined time in the additive latency period.

13. A semiconductor device configured to receive a read or write command and to perform an operation corresponding to the read or write command after a first additive latency period that starts when the semiconductor device receives the read/write command, and further configured to receive an on-die termination (ODT) command and to perform the ODT command after a second additive latency period that starts when the semiconductor device receives the ODT command, the semiconductor device comprising:

a phase controller that controls a phase of a clock signal and outputs a phase-controlled clock signal;

a first controller that generates and outputs a first control signal to change the phase controller from a disabled state to an enabled state at a predetermined time in the first additive latency period; and a second controller that generates and outputs a second control signal to change the phase controller from the disabled state to the enabled state at a predetermined time in the second additive latency period.

14. The semiconductor device of claim 13, wherein the first controller generates and outputs the first control signal with a first logic state to enable the phase controller from the predetermined time in the first additive latency period until a completion time of the operation corresponding to the read or write operation, and generates and outputs the first control signal with a second logic state to disable the phase controller at other points of time, and wherein the second controller generates and outputs the second control signal with the first logic state to enable the phase controller from the predetermined time in the second additive latency period until a completion time of the operation corresponding to the ODT operation, and generates and outputs the second controller with the second logic state to disable the phase controller at other points of time.

15. The semiconductor device of claim 13, wherein the first controller comprises:

a plurality of first delay units that are connected in series, and that delay and output the read or write command according to the clock signal; and a first OR gate that performs an OR operation on at least two signals selected from among the read or write command and output signals of the first delay units, and outputs the first control signal as a result of the OR operation, and wherein the second controller comprises:

a plurality of second delay units that are connected in series, and that delay and output the ODT command according to the clock signal; and a second OR gate that performs an OR operation on at least two signals selected from among the ODT command and output signals of the second delay units, and outputs the second control signal as a result of the OR operation.

16. A semiconductor device configured to receive a read or write command and to perform an operation corresponding to the read or write command after a first additive latency period that starts when the semiconductor device receives the read/write command, and further configured to receive an on-die termination (ODT) command and to perform the ODT command after a second additive latency period that starts when the semiconductor device receives the ODT command, the semiconductor device comprising:

a phase controller configured to control a phase of a clock signal and output a phase-controlled clock signal;

a latency controller configured to generate and output a plurality of latency control signals based on the phase-controlled clock signal;

a first internal command generation unit configured to output an internal read command or an internal write command based on the read or write command after the first additive latency period;

a first command execution controller configured to control the operation corresponding to the read command based on the internal read command and the latency control signals, or to control the operation corresponding to the write command based on the internal write command and the latency control signals;

a second internal command generation unit configured to output an internal ODT command based on the ODT command after the second additive latency period;

a second command execution controller configured to control the operation corresponding to the ODT command based on the internal ODT command and the latency control signals;

a first controller configured to generate and output a first control signal to enable all disabled units among the phase controller, the latency controller, and the first command execution controller at a predetermined time in the first additive latency period; and a second controller configured to generate and output a second control signal to enable all disabled units among the phase controller, the latency controller, and the second command execution controller at a predetermined time in the second additive latency period.

17. The semiconductor device of claim 16, wherein the first controller generates and outputs the first control signal to enable the phase controller, the latency controller, and the first command execution controller from the predetermined time in the first additive latency period until a completion time of the operation corresponding to the read or write command, and generates and outputs the first control signal to disable at least one of the phase controller, the latency controller, and the first command execution controller at other points of time, and wherein the second controller generates and outputs the second control signal to enable the phase controller, the latency controller, and the second command execution controller from the predetermined time in the second additive latency period until a completion time of the operation corresponding to the ODT command, and to disable at least one selected of the phase controller, the latency controller, and the second command execution controller at other points of time.

18. The semiconductor device of claim 16, wherein the first controller comprises:

a first OR gate that performs an OR operation on the read command and the internal read command or on the write command and the internal write command;

a plurality of first delay units that are connected in series, wherein each of the first delay units delays and outputs an output signal of the first OR gate according to the clock signal; and a second OR gate that performs an OR operation on at least two signals from among the output signal of the first OR gate and output signals of the respective first delay units, and then outputs the first control signal as a result of the OR operation of the second OR gate, and wherein the second controller comprises:

a third OR gate that performs an OR operation on the ODT command and the internal ODT command;

a plurality of second delay units that are connected in series, where each of the second delay units delays and outputs an output signal of the third OR gate according to the clock signal; and a fourth OR gate that performs an OR operation on at least two signals from among the output signal of the third OR gate and output signals of the respective second delay units, and then outputs the second control signal as a result of the OR operation of the fourth OR gate.

19. The semiconductor device of claim 16, wherein the latency controller comprises:

a plurality of delay units that are connected in series, wherein each of the delay units delays an output signal of the phase controller and outputs a corresponding one of the latency control signals; and a connection unit that controls a connection between the phase controller and the delay units or between the delay units according to the first control signal or the second control signal.

20. The semiconductor device of claim 16, wherein the first command execution controller comprises:

a plurality of first delay units that are connected in series, and that delay the internal read command or the internal write command according to the latency control signals; and a first connection unit that controls a connection between the latency controller and the first delay units, a connection between the first internal command generation unit and the first delay units, or a connection between the first delay units according to the first control signal, and wherein the second command execution controller comprises:

a plurality of second delay units that are connected in series, and that delay the internal ODT command according to the latency control signals; and a second connection unit that controls a connection between the latency controller and the second delay units, a connection between the second internal command generation unit and the second delay units, or a connection between the second delay units according to the second control signal.

* * * * *